(12) United States Patent  
Steiner et al.

(10) Patent No.: US 8,995,197 B1
(45) Date of Patent: Mar. 31, 2015

(54) SYSTEM AND METHODS FOR DYNAMIC ERASE AND PROGRAM CONTROL FOR FLASH MEMORY DEVICE MEMORIES

(75) Inventors: Avi Steiner, Kiryat Motzkin (IL); Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 261 days.

(21) Appl. No.: 13/595,782

(22) Filed: Aug. 27, 2012

Related U.S. Application Data

(63) Continuation-in-part of application No. 12/769,208, filed on Apr. 28, 2010, now Pat. No. 8,305,812.

(60) Provisional application No. 61/236,911, filed on Aug. 26, 2009.

(51) Int. Cl.
*G11C 11/34* (2006.01)
*G06F 12/02* (2006.01)

(52) U.S. Cl.
CPC ................................. *G06F 12/0246* (2013.01)
USPC ...................................................... 365/185.19

(58) Field of Classification Search
USPC ...................................................... 365/185.19
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Fandrich et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Ting-Chung Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Ting-Chung Hu et al. |
| 5,956,268 A | 9/1999 | Lee |

(Continued)

OTHER PUBLICATIONS

Search Report of PCT Patent Application WO 2009/118720 A3, Mar. 4, 2010.

(Continued)

*Primary Examiner* — Hoai V Ho
*Assistant Examiner* — Pablo Huerta
(74) *Attorney, Agent, or Firm* — Dentons US LLP

(57) ABSTRACT

A computer readable medium, a system and a method for flash memory device parameter optimization, the method may include: receiving or generating an estimate of a wear level of at least one group of flash memory cells of the flash memory device, and finding erase parameters and programming parameters to be applied on one or more groups of flash memory cells of the flash memory device in response to estimate of the wear level.

43 Claims, 16 Drawing Sheets

(56) References Cited

U.S. PATENT DOCUMENTS

| | | | |
|---|---|---|---|
| 5,956,473 A | 9/1999 | Ting-Chung Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,169,825 B1 * | 5/2012 | Shalvi et al. ............ 365/185.09 |
| 8,190,961 B1 | 5/2012 | Yang et al. |
| 8,250,324 B2 | 8/2012 | Haas et al. |
| 8,264,890 B2 * | 9/2012 | Mokhlesi et al. ........ 365/185.29 |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0106972 A1 * | 5/2006 | Gorobets et al. ............ 711/103 |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |

(56) References Cited

U.S. PATENT DOCUMENTS

| | | |
|---|---|---|
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226434 A1* | 9/2007 | Guterman et al. ............. 711/156 |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0294814 A1* | 11/2008 | Gorobets ........................ 710/62 |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0103371 A1* | 4/2009 | Goda et al. ............... 365/185.29 |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174845 A1* | 7/2010 | Gorobets et al. ............... 711/103 |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0202199 A1* | 8/2010 | Guterman et al. ....... 365/185.03 |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0299350 A1* | 11/2010 | Konig et al. ................... 707/769 |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |

(56) References Cited

U.S. PATENT DOCUMENTS

2012/0246391 A1   9/2012   Meir et al.
2014/0156965 A1*  6/2014   Yang et al. ................. 711/172

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26. Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT- 28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

Evaluating sets of eraser parameters by erasing different groups of flash memory cells of the flash memory device that have substantially a same weal level. 531

Limiting the values of the erase parameters to sub-ranges. 532

Finding a set of erase parameters that minimize a formation of traps. 533

Finding a set of erase parameters that minimize a wear of the group of flash memory cells resulting from erase processes. 534

Finding a set of erase parameters that includes at least one of a start erase voltage, a number of maximal allowable erase pulses, an erase pulse width, an erase voltage step and erase level. 535

Evaluating sets of evaluated parameters wherein each set of erase parameters is sub-optimal in a context of voltage threshold distribution. 536

Finding a set of erase parameters in response to a duration attribute of erase operations to be obtained when applying the set of erase parameters. 537

Calculating a score per each set of erase parameter. 538

Increasing at least one parameter out of a start erase voltage, a number of maximal allowable erase pulses, an erase voltage step and erase pulse width with an increase of an order to the sub-range. 539

Finding a set of erase parameters that once applies minimizes a wear level increment resulting from an erase operation. 540

Performing erase operations, during the evaluation of erase parameters, while using "normal" (not test-dedicated) erase parameters. 542

530    FIG. 14

Programming different groups of flash memory cells of the flash memory device that have substantially a same weal level. 561

Limiting the values of the programming parameters to sub-ranges. 562

Finding a set of programming parameters that includes at least one of a start programming voltage, a number of maximal allowable programming pulses, a programming voltage step, a programming pulse width and a program bias voltage. 565

Finding a set of programming parameters in response to a duration attribute of programming operations to be obtained when applying the set of programming parameters. 566

Changing a value of the programming duration threshold in response to values of the wear level. 567

Calculating a score per each set of programming parameter. 568

Increasing at least one parameter out of a number of maximal allowable programming pulses, programming voltage step, programming window, program pulse width and program bias voltage with an increase of an order to the sub-range. 569

Finding a set of programming parameters that once applied minimized a wear level increment resulting from a programming operation. 570

Finding a set of programming parameters of values that once applied will not result in a corruption of data programmed to the flash memory device. 571

Calculating a score of a set of programming parameters in response to statistical attribute of the voltage threshold distribution resulting from applying the set of programming parameters. 572

Performing programming operations, during the evaluation of programming parameters, while using "normal" (not test-dedicated) programming parameters. 573

Repetitively programming same information to multiple groups of flash memory cells while applying different sets of programming parameters that differ from each other. 574

Repetitively programming the same information to multiple groups of flash memory cells if a probability of a programming operation failure exceeds a threshold. 575

Repetitively programming same pilot information to multiple groups of flash memory cells while applying different sets of programming parameters that differ from each other. 575

560    FIG. 15

SYSTEM AND METHODS FOR DYNAMIC ERASE AND PROGRAM CONTROL FOR FLASH MEMORY DEVICE MEMORIES

RELATED APPLICATIONS

This application is a continuation in part of U.S. patent application Ser. No. 12/769,208 having a filing date Apr. 28, 2010, which is incorporated herein by reference.

BACKGROUND OF THE INVENTION

Flash memory device cells are used widely in the industry as memory storage. The flash memory device cell must be able to program, erase and retain charge on its floating gate. During program or erase the flash memory device cell is subject to high electric field to support oxide tunneling and hot electron injection. Those are the mechanisms that may cause reliability failure. Most of the available digital integrated circuits (IC) operate on rail-to-rail logic, flash memory device operation is distinctively analog. The digitally stored information induces analog distribution of the threshold voltage for read operations. In multi-level flash memory device cells, multiple bits are stored by precise placement of threshold voltage in each cell. The readout of the threshold voltage requires precise placement of the sense amplifier decision threshold.

The voltage programming and readout are statistical, and there is therefore a probability of error in each decision. The use of error correction codes (ECC) enables reduction of the error rate to an acceptable value, e.g. $10^{-15}$.

There are currently three common methods of programming flash memory device memory: channel electron ejection, Fowler-Nordhiem (F-N) tunneling from the source or drain, and F-N tunneling from the channel. There are also three common methods for erasing data from the flash memory device memory: F-N tunneling through the channel, F-N tunneling through the source or drain, and F-N tunneling to the floating gate. These techniques, however, require a high electric field in the oxide and may create traps and leakage current.

The result of performing program and erase (P/E) cycles with a fixed set of flash memory device parameters may be highly inefficient. Currently known flash memory device s may be using a single set of program and erase parameters to control the desired program distribution. A significant increase of cycle count for a given margin may be obtained by adapting program and erase parameters to the effective endurance state of the flash memory device.

Another effect of the P/E cycles is the increase of the threshold variance. As the number of cycles increases, the number of traps also increases. The average number of traps reduces the threshold window as discussed above. However, it also increases the threshold variance for every level in the program. The relation to the number of cycles is derived, for example, in an empirical model described in: Mielke, N. Belgal, H. Kalastirsky, I. Kalavade, P. Kurtz, A. Meng, Q. Righos, N. Wu, J. "flash memory device EEPROM Threshold Instabilities Due to Charge Trapping During Programming and/or erase Cycling". IEEE Transactions on Device and Materials Reliability, Vol. 4, No. 3, September 2004, p 335-344, which is incorporated herein in its entirety by reference. The bit error rate of a given flash memory device memory may be related to the threshold voltage window and to the threshold voltage variance at the highest cycle count.

The probability of error may be approximated in different ways, as to allow analytical modelling of the flash memory device cells. One approximation for calculating the probability of error is a Gaussian distribution of the threshold voltage: Where:

The minimum threshold voltage window and the maximum threshold voltage variance may be measured at the maximum cycle counts of a given device (100,000 at Single Level Cell, 1,000 at Multi-Level Cell and 1,000 at 3 bits per cell). The device bit error rate (BER) may therefore not be constant with respect to the cycle count and the numbers of errors may constantly increase as the number of cycle increases. The flash memory device memory controller ECC is designed to correct the highest number of errors at the maximum number of cycles.

There is a growing need to provide computer readable media, methods and systems for increasing the lifespan of flash memory devices.

SUMMARY

According to an embodiment of the invention a method may be provided and may include receiving or generating an estimate of a wear level of at least one group of flash memory cells of the flash memory device; and finding erase parameters and programming parameters to be applied on one or more groups of flash memory cells of the flash memory device in response to estimate of the wear level.

The finding may include evaluating a plurality of sets of evaluated parameters that differ from each other by a value of at least one parameter; wherein each one of the plurality of sets of evaluated parameters comprise at least one out of a set of erase parameters and a set of programming parameters.

The method may include evaluating sets of erase parameters by erasing different groups of flash memory blocks of the flash memory device that have substantially a same weal level.

The method may include evaluating sets of programming parameters by programming different groups of flash memory blocks of the flash memory device that have substantially a same weal level.

Values of the evaluated parameters of each of the different sets of evaluated parameters may be within sub-ranges of possible ranges of values of the evaluated parameters.

The method may include finding a set of evaluated parameters that minimize a formation of traps.

The method may include finding a set of erase parameters that minimize a wear of the group of flash memory cells resulting from erase processes.

The method may include finding a set of erase parameters that may include at least one of a minimal start erase voltage, minimal number of maximal allowable erase pulses, minimal erase pulse width, minimal erase voltage step, erase verify level, maximal number of non-erased cells and maximal erase voltage level.

The method may include finding a set of programming parameters that may include at least one of a maximal start programming voltage, minimal number of maximal allowable programming pulses, minimal programming voltage step, minimal programming pulse width, program verify levels, maximal number of non-verified cells, and minimal program bias voltage.

The method may include finding a selected set of evaluated parameters that has a smallest effect on the wear of the group of flash memory cells out of a plurality of sets of evaluated parameters that once applied introduce a tolerable deviation in a voltage threshold distribution.

The method may include evaluating sets of evaluated parameters wherein each set of erase parameters is sub-optimal in a context of voltage threshold distribution.

The method may include finding a set of erase parameters in response to duration attribute of erase operations to be obtained when applying the set of erase parameters.

The method may include ignoring sets of erase parameters that once applied result in an average duration of erase operations that exceeds an erase duration threshold.

The method may include altering a value of the erase duration threshold in response to values of the wear level.

The method may include finding a set of programming parameters in response to duration attribute of programming operations to be obtained when applying the set of programming parameters.

The method may include ignoring sets of programming parameters that once applied result in an average duration of programming operations that exceeds a programming duration threshold.

The method may include altering a value of the programming length threshold in response to values of the wear level.

The evaluating of the plurality of sets of evaluated parameters may include calculating a score per each set of evaluated parameter.

A score of a set of evaluated parameter is responsive to number of corrected read errors resulting from a read operation that follows a programming operation that was executed by applying programming parameters of the set of the evaluated parameter.

The method may include calculating a score of a set of evaluated parameters in response to at least one value of at least one parameter of the set of evaluated parameters.

The method may include calculating a score of a set of evaluated parameters in response to the wear level.

The method may include calculating a score of a set of evaluated parameters in response to statistical attribute of the voltage threshold distribution resulting from applying the set of evaluated parameters.

Possible values of the estimate of the wear level belong to a range of wear levels that may include multiple non-overlapping sub-ranges of wear levels; wherein the finding is executed at least once for each one for each sub-range of wear levels.

The method may include finding at a beginning of each sub-range of wear levels, erase parameters and programming parameters to be applied during the entire sub-range of wear levels.

Sub-ranges of higher order may be associated with higher wear levels; wherein the method may include modifying at least one parameter out of a number of maximal allowable programming pulses, start program voltage, programming voltage step, programming window, number of non-verified programmed cells, program pulse width and program bias voltage with an increase of an order to the sub-range.

Sub-ranges of higher order may be associated with higher wear levels; wherein the method may include modifying at least one parameter out of a start erase voltage, a number of maximal allowable erase pulses, an erase voltage step and erase pulse width with an increase of an order to the sub-range.

The method may include finding a set of evaluated parameters that once applied results in manageable level of bit error rates that exceeds a minimal allowable level of bit error rates.

The method may include selecting a set of evaluated parameters that once applied results in manageable level of bit error rates and has a smallest contribution to a wear level of the at least one group of flash memory cells.

The method may include selecting a set of evaluated parameters that once applied results in a higher bit error rate at low wear levels and a lower increment rate of bit error rates per wear level in relation to at least one other set of evaluated parameters.

The method may include selecting a set of evaluated parameters that once applied results in (a) a higher bit error rate and a lower programming duration at low wear levels and (b) a lower increment rate of bit error rates per wear level in relation to at least one other set of evaluated parameters.

The method may include selecting a set of evaluated parameters that once applied results in a higher bit error rate at low wear levels and at a lower increment rate of bit error rates per wear level in relation to a reference set of parameters that is expected to be applied regardless of a wear level of the at least one group of flash memory cells.

Each set of evaluated parameters may include erase and programming parameters of values that once applied will not result in a corruption of data programmed to the flash memory device.

Each set of evaluated parameters may include programming parameters that may be applied during programming operations of information that is not related to the finding of the erase parameters and the programming parameters.

The finding may include repetitively programming same information to multiple groups of flash memory cells while applying different sets of programming parameters that differ from each other.

The method may include repetitively programming the same information to multiple groups of flash memory cells is a probability of a programming operation failure exceeds a threshold.

The finding may include repetitively programming same pilot information to multiple groups of flash memory cells while applying different sets of programming parameters that differ from each other.

The finding may include applying a steepest decent algorithm.

The finding may include changing a value of a single evaluated parameter between one set of evaluated parameter to another.

The method may include: evaluating a first set of evaluated parameters; calculating a first score; changing a single parameter of the first set to provide a second set of evaluated parameters that may include a single changed parameter; wherein the changing is performed along a first change direction; evaluating the second set of evaluated parameters; calculating a second score; determining, in response to the first and second scores, whether the first set of evaluated parameters achieves better results than the second set of evaluated parameters; if it is determined that the first set of evaluated parameters achieves better results than the second set of evaluated parameters then changing the single changed parameter along a second change direction that differs from the first change direction to provide a third set of evaluated parameters; if it is determined that the first set of evaluated parameters achieves worse results than the second set of evaluated parameters then changing the single changed parameter along the first direction to provide the third set of evaluated parameters.

The method may include evaluating a single set of evaluated parameters based upon an outcome of multiple read attempts.

The finding is triggered when a bit error rate, which is calculated during a read operation, is associated with information programmed to at least one group of flash memory cells reaches a predetermined value.

The method may include finding a set of erase parameters that once applied minimizes a wear level increment resulting from a programming operation.

Further embodiments of the invention include a computer readable medium that is non-transitory and may store instructions for performing the above-described methods and any steps thereof, including any combinations of same. For example, the computer readable medium may store instructions for receiving or generating an estimate of a wear level of at least one group of flash memory cells of the flash memory device; and finding erase parameters and programming parameters to be applied on one or more groups of flash memory cells of the flash memory device in response to estimate of the wear level.

The non-transitory computer readable medium may store instructions for finding that may include evaluating a plurality of sets of evaluated parameters that differ from each other by a value of at least one parameter; wherein each one of the plurality of sets of evaluated parameters comprise at least one out of a set of erase parameters and a set of programming parameters.

The non-transitory computer readable medium may store instructions for evaluating sets of erase parameters by erasing different groups of flash memory blocks of the flash memory device that have substantially a same weal level.

The non-transitory computer readable medium may store instructions for evaluating sets of programming parameters by programming different groups of flash memory blocks of the flash memory device that have substantially a same weal level.

Values of the evaluated parameters of each of the different sets of evaluated parameters may be within sub-ranges of possible ranges of values of the evaluated parameters.

The non-transitory computer readable medium may store instructions for finding a set of evaluated parameters that minimize a formation of traps.

The non-transitory computer readable medium may store instructions for finding a set of erase parameters that minimize a wear of the group of flash memory cells resulting from erase processes.

The non-transitory computer readable medium may store instructions for finding a set of erase parameters that may include at least one of a minimal start erase voltage, minimal number of maximal allowable erase pulses, minimal erase pulse width, minimal erase voltage step, erase verify level, maximal number of non-erased cells and maximal erase voltage level.

The non-transitory computer readable medium may store instructions for finding a set of programming parameters that may include at least one of a maximal start programming voltage, minimal number of maximal allowable programming pulses, minimal programming voltage step, minimal programming pulse width, program verify levels, maximal number of non-verified cells, and minimal program bias voltage.

The non-transitory computer readable medium may store instructions for finding a selected set of evaluated parameters that has a smallest effect on the wear of the group of flash memory cells out of a plurality of sets of evaluated parameters that once applied introduce a tolerable deviation in a voltage threshold distribution.

The non-transitory computer readable medium may store instructions for evaluating sets of evaluated parameters wherein each set of erase parameters is sub-optimal in a context of voltage threshold distribution.

The non-transitory computer readable medium may store instructions for finding a set of erase parameters in response to duration attribute of erase operations to be obtained when applying the set of erase parameters.

The non-transitory computer readable medium may store instructions for ignoring sets of erase parameters that once applied result in an average duration of erase operations that exceeds an erase duration threshold.

The non-transitory computer readable medium may store instructions for altering a value of the erase duration threshold in response to values of the wear level.

The non-transitory computer readable medium may store instructions for finding a set of programming parameters in response to duration attribute of programming operations to be obtained when applying the set of programming parameters.

The non-transitory computer readable medium may store instructions for ignoring sets of programming parameters that once applied result in an average duration of programming operations that exceeds a programming duration threshold.

The non-transitory computer readable medium may store instructions for altering a value of the programming length threshold in response to values of the wear level.

The evaluating of the plurality of sets of evaluated parameters may include calculating a score per each set of evaluated parameter.

A score of a set of evaluated parameter is responsive to number of corrected read errors resulting from a read operation that follows a programming operation that was executed by applying programming parameters of the set of the evaluated parameter.

The non-transitory computer readable medium may store instructions for calculating a score of a set of evaluated parameters in response to at least one value of at least one parameter of the set of evaluated parameters.

The non-transitory computer readable medium may store instructions for calculating a score of a set of evaluated parameters in response to the wear level.

The non-transitory computer readable medium may store instructions for calculating a score of a set of evaluated parameters in response to statistical attribute of the voltage threshold distribution resulting from applying the set of evaluated parameters.

Possible values of the estimate of the wear level belong to a range of wear levels that may include multiple non-overlapping sub-ranges of wear levels; wherein the finding is executed at least once for each one for each sub-range of wear levels.

The non-transitory computer readable medium may store instructions for finding at a beginning of each sub-range of wear levels, erase parameters and programming parameters to be applied during the entire sub-range of wear levels.

Sub-ranges of higher order may be associated with higher wear levels; wherein The non-transitory computer readable medium may store instructions for modifying at least one parameter out of a number of maximal allowable programming pulses, start program voltage, programming voltage step, programming window, number of non-verified programmed cells, program pulse width and program bias voltage with an increase of an order to the sub-range.

Sub-ranges of higher order may be associated with higher wear levels. The non-transitory computer readable medium may store instructions for modifying at least one parameter out of a start erase voltage, a number of maximal allowable erase pulses, an erase voltage step and erase pulse width with an increase of an order to the sub-range.

The non-transitory computer readable medium may store instructions for finding a set of evaluated parameters that once applied results in manageable level of bit error rates that exceeds a minimal allowable level of bit error rates.

The non-transitory computer readable medium may store instructions for selecting a set of evaluated parameters that once applied results in manageable level of bit error rates and has a smallest contribution to a wear level of the at least one group of flash memory cells.

The non-transitory computer readable medium may store instructions for selecting a set of evaluated parameters that once applied results in a higher bit error rate at low wear levels and a lower increment rate of bit error rates per wear level in relation to at least one other set of evaluated parameters.

The non-transitory computer readable medium may store instructions for selecting a set of evaluated parameters that once applied results in (a) a higher bit error rate and a lower programming duration at low wear levels and (b) a lower increment rate of bit error rates per wear level in relation to at least one other set of evaluated parameters.

The non-transitory computer readable medium may store instructions for selecting a set of evaluated parameters that once applied results in a higher bit error rate at low wear levels and at a lower increment rate of bit error rates per wear level in relation to a reference set of parameters that is expected to be applied regardless of a wear level of the at least one group of flash memory cells.

each set of evaluated parameters may include erase and programming parameters of values that once applied will not result in a corruption of data programmed to the flash memory device.

Each set of evaluated parameters may include programming parameters that may be applied during programming operations of information that is not related to the finding of the erase parameters and the programming parameters.

The finding may include repetitively programming same information to multiple groups of flash memory cells while applying different sets of programming parameters that differ from each other.

The non-transitory computer readable medium may store instructions for repetitively programming the same information to multiple groups of flash memory cells is a probability of a programming operation failure exceeds a threshold.

The finding may include repetitively programming same pilot information to multiple groups of flash memory cells while applying different sets of programming parameters that differ from each other.

The finding may include applying a steepest decent algorithm.

The finding may include changing a value of a single evaluated parameter between one set of evaluated parameter to another.

The non-transitory computer readable medium may store instructions for evaluating a first set of evaluated parameters; calculating a first score; changing a single parameter of the first set to provide a second set of evaluated parameters that may include a single changed parameter; wherein the changing is performed along a first change direction; evaluating the second set of evaluated parameters; calculating a second score; determining, in response to the first and second scores, whether the first set of evaluated parameters achieves better results than the second set of evaluated parameters; if it is determined that the first set of evaluated parameters achieves better results than the second set of evaluated parameters then changing the single changed parameter along a second change direction that differs from the first change direction to provide a third set of evaluated parameters; if it is determined that the first set of evaluated parameters achieves worse results than the second set of evaluated parameters then changing the single changed parameter along the first direction to provide the third set of evaluated parameters.

The non-transitory computer readable medium may store instructions for evaluating a single set of evaluated parameters based upon an outcome of multiple read attempts.

The finding is triggered when a bit error rate, which is calculated during a read operation, is associated with information programmed to at least one group of flash memory cells reaches a predetermined value.

The non-transitory computer readable medium may store instructions for finding a set of erase parameters that once applied minimizes a wear level increment resulting from a programming operation.

Additional embodiments of the invention include a system arranged to execute any or all of the methods described above, including any stages and any combinations of same. For example, the system may include a flash memory that may be arranged to receive or generate an estimate of a wear level of at least one group of flash memory cells of the flash memory device; and find erase parameters and programming parameters to be applied on one or more groups of flash memory cells of the flash memory device in response to estimate of the wear level.

The finding may include evaluate a plurality of sets of evaluated parameters that differ from each other by a value of at least one parameter; wherein each one of the plurality of sets of evaluated parameters comprise at least one out of a set of erase parameters and a set of programming parameters.

The flash memory controller may be arranged to evaluate sets of erase parameters by erasing different groups of flash memory blocks of the flash memory device that have substantially a same weal level.

The flash memory controller may be arranged to evaluate sets of programming parameters by programming different groups of flash memory blocks of the flash memory device that have substantially a same weal level.

Values of the evaluated parameters of each of the different sets of evaluated parameters may be within sub-ranges of possible ranges of values of the evaluated parameters.

The flash memory controller may be arranged to find a set of evaluated parameters that minimize a formation of traps.

The flash memory controller may be arranged to find a set of erase parameters that minimize a wear of the group of flash memory cells resulting from erase processes.

The flash memory controller may be arranged to find a set of erase parameters that may include at least one of a minimal start erase voltage, minimal number of maximal allowable erase pulses, minimal erase pulse width, minimal erase voltage step, erase verify level, maximal number of non-erased cells and maximal erase voltage level.

The flash memory controller may be arranged to find a set of programming parameters that may include at least one of a maximal start programming voltage, minimal number of maximal allowable programming pulses, minimal programming voltage step, minimal programming pulse width, program verify levels, maximal number of non-verified cells, and minimal program bias voltage.

The flash memory controller may be arranged to find a selected set of evaluated parameters that has a smallest effect on the wear of the group of flash memory cells out of a plurality of sets of evaluated parameters that once applied introduce a tolerable deviation in a voltage threshold distribution.

The flash memory controller may be arranged to evaluate sets of evaluated parameters wherein each set of erase parameters is sub-optimal in a context of voltage threshold distribution.

The flash memory controller may be arranged to find a set of erase parameters in response to duration attribute of erase operations to be obtained when applying the set of erase parameters.

The flash memory controller may be arranged to ignore sets of erase parameters that once applied result in an average duration of erase operations that exceeds an erase duration threshold.

The flash memory controller may be arranged to alter a value of the erase duration threshold in response to values of the wear level.

The flash memory controller may be arranged to find a set of programming parameters in response to duration attribute of programming operations to be obtained when applying the set of programming parameters.

The flash memory controller may be arranged to ignore sets of programming parameters that once applied result in an average duration of programming operations that exceeds a programming duration threshold.

The flash memory controller may be arranged to alter a value of the programming length threshold in response to values of the wear level.

The evaluating of the plurality of sets of evaluated parameters may include calculate a score per each set of evaluated parameter.

A score of a set of evaluated parameter is responsive to number of corrected read errors resulting from a read operation that follows a programming operation that was executed by applying programming parameters of the set of the evaluated parameter.

The flash memory controller may be arranged to calculate a score of a set of evaluated parameters in response to at least one value of at least one parameter of the set of evaluated parameters.

The flash memory controller may be arranged to calculate a score of a set of evaluated parameters in response to the wear level.

The flash memory controller may be arranged to calculate a score of a set of evaluated parameters in response to statistical attribute of the voltage threshold distribution resulting from applying the set of evaluated parameters.

Possible values of the estimate of the wear level belong to a range of wear levels that may include multiple non-overlapping sub-ranges of wear levels; wherein the finding is executed at least once for each one for each sub-range of wear levels.

The flash memory controller may be arranged to find at a beginning of each sub-range of wear levels, erase parameters and programming parameters to be applied during the entire sub-range of wear levels.

Sub-ranges of higher order may be associated with higher wear levels; wherein The flash memory controller may be arranged to modify at least one parameter out of a number of maximal allowable programming pulses, start program voltage, programming voltage step, programming window, number of non-verified programmed cells, program pulse width and program bias voltage with an increase of an order to the sub-range.

Sub-ranges of higher order may be associated with higher wear levels; wherein The flash memory controller may be arranged to modify at least one parameter out of a start erase voltage, a number of maximal allowable erase pulses, an erase voltage step and erase pulse width with an increase of an order to the sub-range.

The flash memory controller may be arranged to find a set of evaluated parameters that once applied results in manageable level of bit error rates that exceeds a minimal allowable level of bit error rates.

The flash memory controller may be arranged to select a set of evaluated parameters that once applied results in manageable level of bit error rates and has a smallest contribution to a wear level of the at least one group of flash memory cells.

The flash memory controller may be arranged to select a set of evaluated parameters that once applied results in a higher bit error rate at low wear levels and a lower increment rate of bit error rates per wear level in relation to at least one other set of evaluated parameters.

The flash memory controller may be arranged to select a set of evaluated parameters that once applied results in (a) a higher bit error rate and a lower programming duration at low wear levels and (b) a lower increment rate of bit error rates per wear level in relation to at least one other set of evaluated parameters.

The flash memory controller may be arranged to select a set of evaluated parameters that once applied results in a higher bit error rate at low wear levels and at a lower increment rate of bit error rates per wear level in relation to a reference set of parameters that is expected to be applied regardless of a wear level of the at least one group of flash memory cells.

Each set of evaluated parameters may include erase and programming parameters of values that once applied will not result in a corruption of data programmed to the flash memory device.

Each set of evaluated parameters may include programming parameters that may be applied during programming operations of information that is not related to the finding of the erase parameters and the programming parameters.

The flash memory controller may repetitively program same information to multiple groups of flash memory cells while applying different sets of programming parameters that differ from each other.

The flash memory controller may be arranged to repetitively program the same information to multiple groups of flash memory cells is a probability of a programming operation failure exceeds a threshold.

The flash memory controller may be arranged to repetitively program the same pilot information to multiple groups of flash memory cells while applying different sets of programming parameters that differ from each other.

The finding, by the flash memory controller, may include applying a steepest decent algorithm.

The finding by the flash memory controller may include changing a value of a single evaluated parameter between one set of evaluated parameter to another.

The flash memory controller may be arranged to evaluate a first set of evaluated parameters; calculate a first score; change a single parameter of the first set to provide a second set of evaluated parameters that may include a single changed parameter; wherein the change is performed along a first change direction; evaluate the second set of evaluated parameters; calculate a second score; determine, in response to the first and second scores, whether the first set of evaluated parameters achieves better results than the second set of evaluated parameters; if it is determined that the first set of evaluated parameters achieves better results than the second set of evaluated parameters then change the single changed parameter along a second change direction that differs from the first change direction to provide a third set of evaluated parameters; if it is determined that the first set of evaluated parameters achieves worse results than the second set of evaluated parameters then change the single changed parameter along the first direction to provide the third set of evaluated parameters.

The flash memory controller may be arranged to evaluate a single set of evaluated parameters based upon an outcome of multiple read attempts.

The flash memory controller may be arranged to trigger the finding when a bit error rate, which is calculated during a read operation, is associated with information programmed to at least one group of flash memory cells reaches a predetermined value.

The flash memory controller may be arranged to find a set of erase parameters that once applied minimizes a wear level increment resulting from a programming operation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5-15 illustrate various methods according to various embodiments of the invention.

Figure 1:
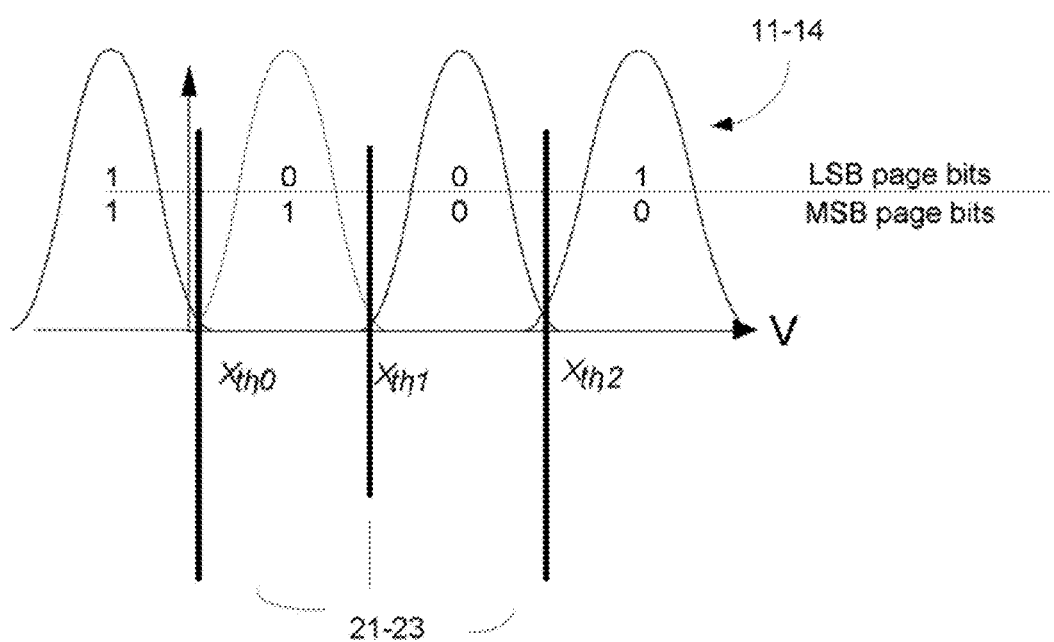
FIG. 1 illustrates a prior art threshold voltage distribution.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details may be set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The terms process and method are used interchangeably in this specification.

According to various embodiments of the invention there are provided methods, non-transitory computer readable media and systems that dynamically optimize erase and programming parameters of a flash memory device memory device as a function of the endurance of the flash memory device memory device. This may obtain a high reliability level and a high endurance of the flash memory device memory device.

According to an embodiment of the invention the optimization method of the erase parameters is aimed to reduce and even minimize the wear effect involved with an erase operation as function of the endurance.

According to an embodiment of the invention programming parameters are dynamically optimized in order to minimize induced bit error rate (BER) and the standard deviation (STD) of the voltage threshold distribution of the programming operation.

According to an embodiment of the invention the optimization method of the programming parameters can be done by using a steepest-decent search for minimum, without adding any system overhead.

According to an embodiment of the invention the optimization method rules are designed so that using non-optimal erase or programming parameters are harmless, and do not induce extra programming operations. The evaluation of the programming parameters can be done without performance penalties since the scores that are used for the evaluation process are obtained through normal (non-dedicated) read operations of the previously programmed content.

The optimization method may be executed as an ongoing process, or may be limited to a fixed number of parameters modifications for a single or multiple program erase (P/E) cycle ranges.

It is noted that erase optimization method and/or program optimization method may have a complimentary contribution to the endurance maximization over the flash memory device memory device life span. According to various embodiments of the invention each of the optimization method (erase optimization method and program optimization method) may be done separately, or jointly. For example, the erase optimization method may be tuned as to minimize the wear effect at the expense of high program induced BER, while the program optimization method may be further tuned to minimize the BER of the programming.

Either one of the optimization methods may be done under constraints of average program time and average erase time. These constraints may change as a function of endurance.

The optimization method can evaluate the outcome of using certain programming parameters and/or erase parameter by computing one or more scores. One of these scores can be an error-score that may be measured on a whole block or on a subset of pages within a block.

The program optimization method does not have to use dedicated data, but may be implemented during programming of operational data into the flash memory device memory device. However, applications that run the program optimization method may check the validity of the programming result, and decide to re-program the same data in case the programming with modified parameters failed.

The programming optimization method may benefit also from applying a virtual retention effect function, as illustrated in U.S. patent application Ser. No. 12/769,208 filing date Apr. 28, 2010, which is incorporated herein by reference.

The span of the programming parameters, subject for optimization, may be set such to exclude values which might have a destructive impact on the programming result. Thus, only a sub-rage of values may be tested. For example, different combination of programming parameter values or extreme valid values for different programming parameters may lead to a failure in the programming, meaning that the data programmed cannot be reliably read after programming. Such scenarios may be avoided by limiting the span of parameters change in advance, according to the embodiments of this invention.

Any one of the erase optimization method and/or program optimization method can be performed in a periodical manner (for example—for every P/E cycle range—corresponding to a weal level sub-range), or triggered by events such as changes in a score that is computed during read operations done by a host (without adding extra read operations), or changes in a score computed from dedicated read operations which examine the programming results.

According to various embodiments of the invention the set of programming and/or erase parameters may be either predetermined per P/E cycle range, or may be the last set used following the previous optimization method.

The programming optimization method and/or the erase optimization method may include testing a different set of parameters for optimization. For example, it may be required that the programming verify levels remain unchanged during the optimization method, while parameters like the programming start voltage and the program voltage step will be part of the optimization method According to various embodiments of the invention the score computation for evaluating the program and/erase optimization method can be (a) dependent on the programming/erase parameters, (b) dependent on the read errors or/and lobes' distribution, and (c) change as a function of the P/E cycle value (or effective wear levels changes).

FIG. 1 illustrates a prior art voltage threshold distribution of a 2 bits per cell (bpc) flash memory device memory device. The voltage threshold distribution includes four lobes 11-14. A MSB read threshold Xth,1 22 is used to read the MSB pages. For reading LSB pages the read thresholds Xth,0 and Xth,2 21 and 23 are used. The lowest (leftmost) distribution is known as the erase level or erase lobe 11.

In order to reach high endurance it is required to adapt the programming scheme on the fly, per device. To do this it is suggested to modify the programming and erase parameters as function of the endurance (represented by P/E cycle count) or another wear level. A method for calculating wear level (also referred to as effective P/E cycle count) is illustrated in U.S. patent application Ser. No. 13/342,946 which is incorporated herein by reference.

An equivalent P/E cycles count which is estimated according to the last programming result. The estimate can be based on the average programming time and/or on the number of errors following the programming operation. In some cases there may be a strong correspondence between the number of errors during the programming and the wear level.

Controlling the erase parameters as function of the wear level (effective P/E cycles) can assist in obtaining high endurance and reliability. The erase parameters can be controlled such that the traps accumulation during erase will be as small as possible. If done carefully, may reduce dramatically the wear out of the cell per erase operation.

For example, performing an erase operation with as small erase voltage and minimal number of pulses, and to a highest possible erase level, may minimize the inherent destructive effect of the erase operation.

Such strategy may result however in higher errors during the programming operation, or result in a wider distribution, i.e. high standard deviation per lobe. An example for erase adaptation to wear state is disclosed in U.S. patent application Ser. No. 13/238,983 which is incorporated herein by reference.

Naturally, this may seem to contradict the goal of programming optimization method which aims at minimizing the BER and STD corresponding to a programming operation.

In this application a method for controlling the erase and programming parameters is disclosed. According to the embodiments of this invention, a tradeoff between the two contradicting targets is found such that the overall endurance is maximized without sacrificing the reliability. Erase parameters may be set in view of the programming parameters.

The optimization method can result by having a programming operation that follows an erase operation, to end up with a relatively high BER, which is still reliably corrected following a read operation and error correction. The programming parameters are optimized as to minimize the BER and STD of the program induced distribution. This goal is achieved with different programming and/or erase parameters as the endurance changes.

In many flash memory device memory controllers, management software makes nearly equal wear to large sets of physical blocks. That is known as wear leveling. When using wear leveling, the overhead of the erase and programming optimization methods may be minimized since it may be sufficient to optimize parameters on sample blocks for every P/E cycle range. That is, it is not needed to apply such optimization method for every block and every programming operation. It is possible, for example, to perform this optimization method at every cycle P/E range, like demonstrated in the tables below.

Table 1 provides an example of a set of erase parameters used per cycle range, as initial conditions for further optimization method.

| | Initial Erase Parameters | | | | | |
|---|---|---|---|---|---|---|
| Cycles | Start Erase Voltage | Max. number of erase pulses | Erase voltage step up | Erase pulse width | Erase verify level | Number of unverified cells |
| 0-1000 | 14V | 5 | 0.1V | 1 | 0V | 30 |
| 1000-2000 | 14.5V | 7 | 0.15V | 2 | −0.3V | 30 |
| . | . | . | . | | | |
| . | . | . | . | | | |
| . | . | . | . | | | |
| 19,000-20,000 | 16V | 15 | 0.3V | 4 | −1.5V | 40 |

Table 2 illustrates an example of a set of programming parameters used per cycle range, as initial conditions for further optimization method.

| | Initial Programming Parameters | | | | | | |
|---|---|---|---|---|---|---|---|
| Cycles | Start program Voltage MSB/LSB | Max. number of prog. pulses | Prog. voltage step up | Prog. pulse width | Program verify levels [L1, L2, L3] [V] | Number of unverified cells | Program Bias Voltage (pass voltage) |
| 0-1000 | 13V | 5 | 0.2V | 1 | [0, 1.5, 3] | 30 | 6.5V |
| 1000-2000 | 12.5V | 7 | 0.1V | 2 | [0.5, 2.2, 3.9] | 30 | 7V |
| . | . | . | . | | | | |
| . | . | . | . | | | | |
| . | . | . | . | | | | |
| 19,000-20,000 | 11V | 15 | 0.05V | 4 | [1, 2.6, 5.1] | 40 | 8V |

Figure 2:
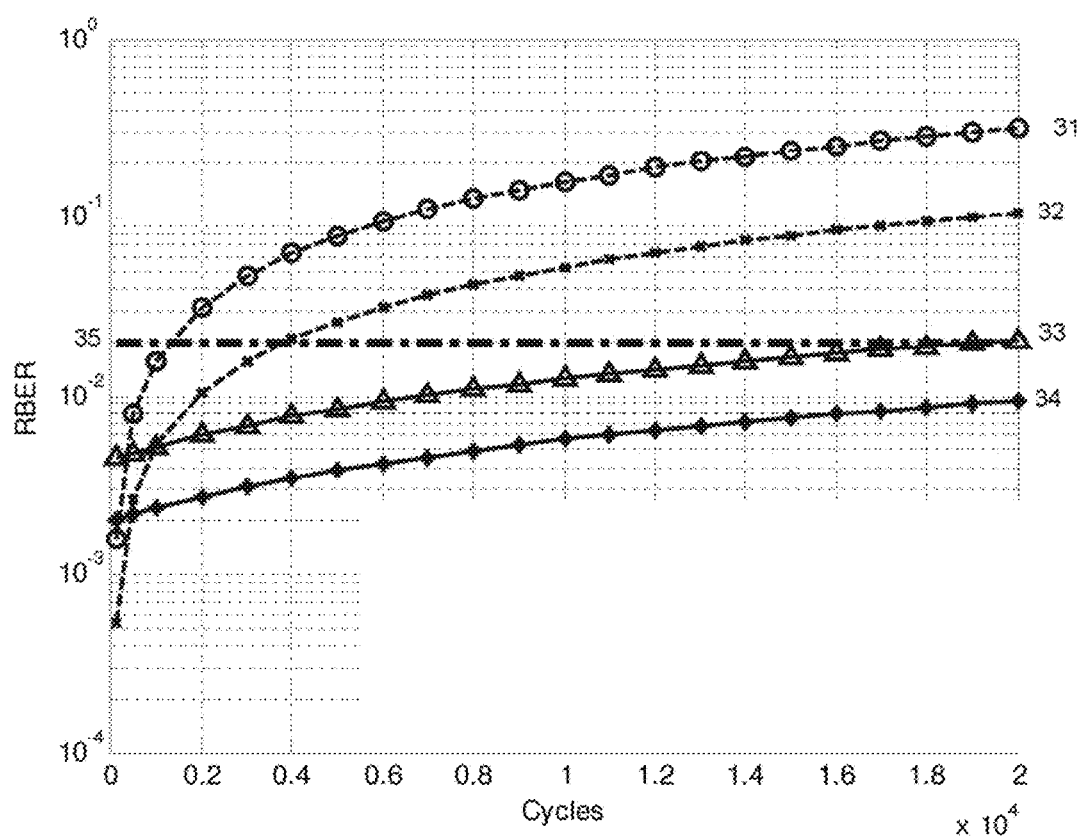
FIG. 2 illustrates program erase (P/E) cycle count values versus raw bit error rate (RBER) of a prior art scheme and of methods according to an embodiment of the invention.

FIG. 2 is a graph 30 that shows P/E cycle count values versus raw bit error rate (RBER) values according to an embodiment of the invention.

The x-axis of graph 30 represents that number of P/E cycle counts that typical blocks in the flash memory device have undergone. The y-axis represents the average raw bit error rate (RBER) when reading from the flash memory device, and applying (if needed) a read operation (to be applied by a read circuit that may be equipped with a Digital Signal Processor) which allocates approximately optimal read thresholds.

Graph 30 includes a reliable error correction decoding threshold 35, curves 31 and 32 illustrating the behaviour (P/E count values versus RBER) of prior art schemes that are fixed (use the same erase and programming parameters) regardless the P/E cycle count—before and after retention.

Graph 30 also includes curves 33 and 34 illustrating the behaviour (P/E count values versus RBER) of applying a method according to an embodiment of the invention—before and after retention.

As may be noticed, the average RBER grows with the P/E cycle count, and further more with retention. Using prior art programming/erase methods, the RBER at low cycle counts is fairly small. However, it increases at a rather high slope. This is due to the accelerated wear associated with every program and erase operation which are fixed. According to embodiments of this invention, the RBER of low cycle counts is rather high. This is due to using programming parameters that allow fast programming, at the expense of program level distribution (i.e. wide lobe distribution). This is also due to programming on a smaller voltage window on initial cycles. The smaller programming voltage window contributes to the minimization of the device wear due to program and erase operations. The higher RBER at low P/E cycles can be tolerated by the ECC, and therefore has no negative impact on read performance.

Another benefit of the embodiments of this invention is that the RBER slope is smaller than the RBER slope of prior art. The smaller slope allows achieving more P/E cycles with reliable decoding after retention. For example, like shown in the figure below, the adaptive programming and erase after retention at 20,000 cycles reaches the ECC limit of 2 E-2, in the example. Comparing this to prior art, with the same ECC limit, it may be noticed that only a little above 1,000 cycles may be reached post retention. Thus the adaptive programming and erase may greatly improve reliability and increase the lifespan of a flash memory device.

Figure 3:
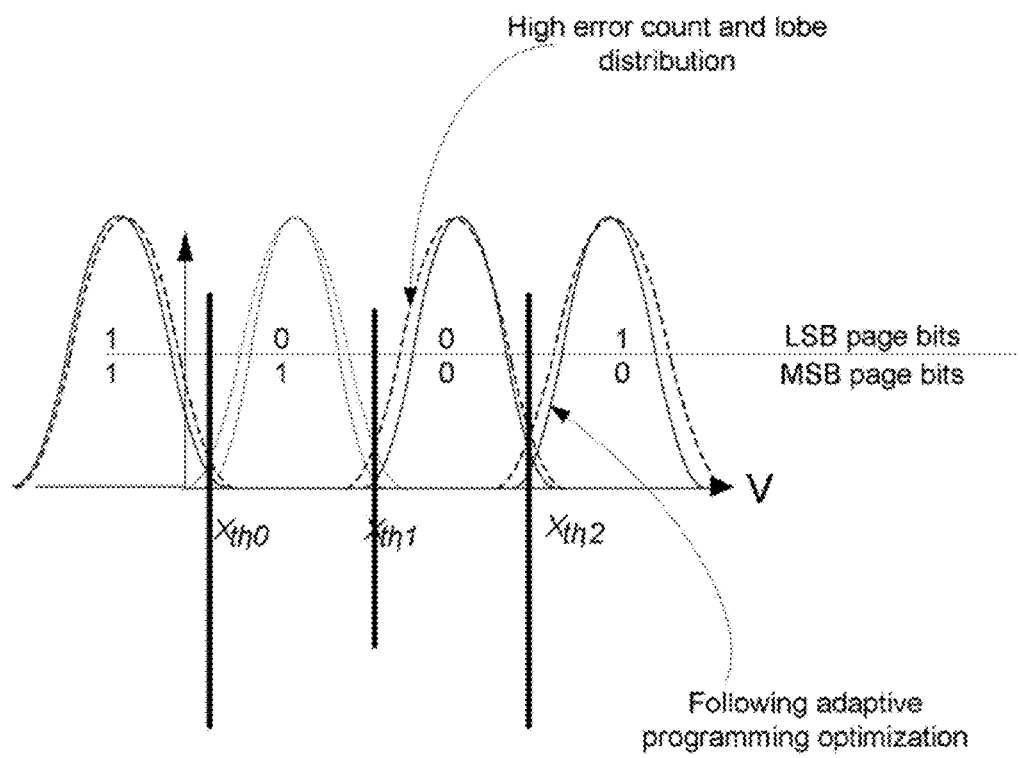
FIG. 3-4 illustrate threshold voltage distributions according to an embodiment of the invention in comparison with prior art threshold voltage distributions.

FIG. 3 demonstrates the benefit of programming with optimized adaptive programming parameters, according to embodiments of this invention.

FIG. 3 illustrates a voltage threshold distribution of a 2-bits per cell (bpc) device. The dashed distribution (lobes 11-14) refers to a distribution associated with prior art programming schemes, while the solid line distribution (lobes 41-44) is associated with the programming result when using optimized programming parameters.

At rather high cycle counts (e.g. above 1000 cycles), using the default programming parameters (fixed parameters), results in high standard deviation (STD) around every program level. This causes a high RBER during read with (near) optimal thresholds. If programming is done with adaptive programming, like disclosed in the specification, the STD around every program level is reduced as well as the RBER during read with (near) optimal thresholds.

Figure 4:
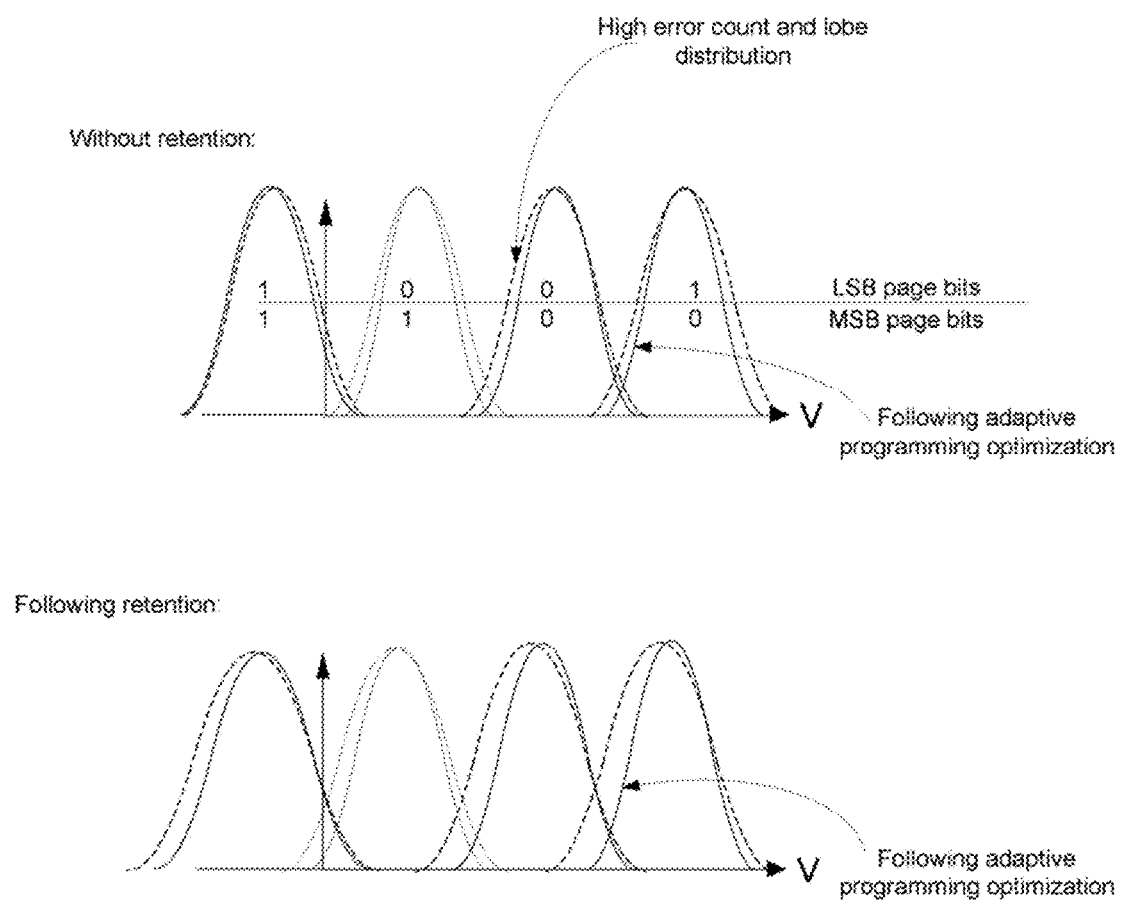

FIG. 4 exemplifies the difference in programming voltage threshold distribution when using adaptive programming versus fixed parameters, before and after retention.

The dashed distribution (lobes 11-14) refers to a distribution associated with prior art programming schemes, while the solid line distribution (lobes 41-44) is associated with the programming result when using optimized programming parameters. The upper most graphs are the programming distribution without retention. The lower graphs are the post-retention voltage threshold distribution. As may be noticed from the post-retention distribution, the retention effect is more severe in the prior art implementation evident from a larger shift of the programming levels, and a larger increase in STD per programming level. The post-retention distribution associated with adaptive program and adaptive erase exhibits a smaller shift in the average program levels, and a smaller increase in the STD of the voltage threshold distribution around every level. This results in lower RBER during read operations, which in total allows reliable readouts at higher cycle counts.

Figure 5:
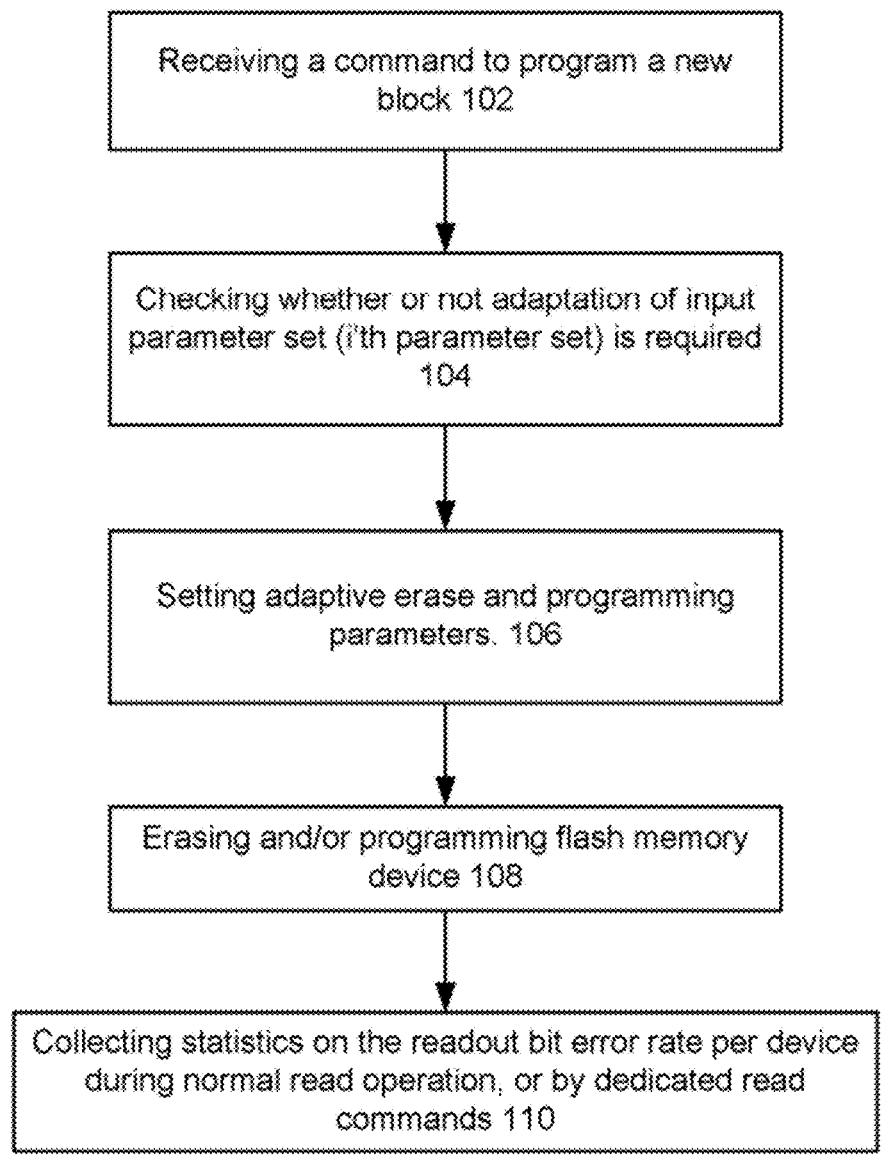

FIG. 5 illustrates an optimization method 100 in accordance to embodiments of the invention.

The optimization method can include adapting error parameters and/or programming parameters. The programming and/or erase parameter optimization may be done without adding pilot/training data to the programming operation.

The optimization method 100 can start by receiving (102) a new programming command from an application executed by a host computer.

The flash memory controller may check if adaptation of the erase and/or programming parameters is required (104).

The checking may include using the score of read bit error rates (BER) from the read of previous programming. The RBER can be combined with programming time and erase time to provide a common score. Furthermore, the RBER is measured on different pages. The controller may take an average value, and max BER value, over a subset of programmed pages. The score may be for example a weighted sum of the mean BER and the maximal BER, i.e.

$$\text{score} = \beta \cdot \bar{e} + (1-\beta) \cdot \max(e) + M \cdot 1(T_{prog} > TH_p) + L \cdot 1(T_{erase} > TH_e)$$

Where $0 \leq \beta \leq 1$ is a weighting factor of the BER vector e, and $\bar{e}$ is the average BER and max(e) is the highest measured readout BER. The parameters M, L are penalty factors, which may be added to the score in case of constraint violation of the programming time Tprog or the erase time Terase, respectively.

The score may be even more generic and include more elements having to do with the programming and/or erase parameters, e.g.

score=$\beta$·
$\bar{e}$+(1–$\beta$)·max(e)+$f_p$(Tprog–THp)+$f_e$(Terase–THe)+$g_e$(Erase Vstart,EraseVoltageStep,NppErase)+$g_p$(PgVstart, PgVoltageStep,NppPg)

Where $f_e$ and $f_p$ are functions of the program time result w.r.t. a threshold parameter, and may for example be an increasing function as the deviation from the threshold increases, e.g. $f_e$=a·(Terase–THe)·1(Terase–THe) where a is a positive scalar, and 1(x) is a step function which is 1 if x>0, otherwise 0.

The functions $g_e$ and $g_p$ are cost functions which depend on erase and programming parameters, respectively. For example, the higher the erase start voltage, the lower the cost may be. The functions perform weighting of the different parameters according to their actual contribution to the programming and erase results.

In case it is required to perform an optimization method of programming and/or erase, then the controller modifies the erase/programming parameters, and sets them (106) to the flash memory device, according to embodiments of the invention, and erases/programs (108) the next block according to management and application requirements, and then re-computes the score (110) following the program operation.

It is emphasized that the optimization method may be an on-going operation done simultaneously with the normal program/read commands issued by the host, as to introduce no overhead on read and write performance.

According to another embodiment of this invention, the parameter optimization method is done separately and possibly even differently per flash memory device. This is explained as follows: a controller might have an array of flash memory device dies, which are jointly programmed, in order to improve system performance. The read and write operations may be done faster if interleaving of codewords is done over multiple devices. In addition, the programming and/or erase optimization method may end up with different parameters optimizing the score per device. Therefore, the controller may collect RBER information and tProg and tErase from every device separately. For computing RBER of a multi-die interleaved codeword, the controller shall count the number of errors detected in the portion of the codeword that belongs to a specific single die. This may enable computing a score(d), i.e. a score for every device, which corresponds to the last parameters used for erase/program.

Figure 6:
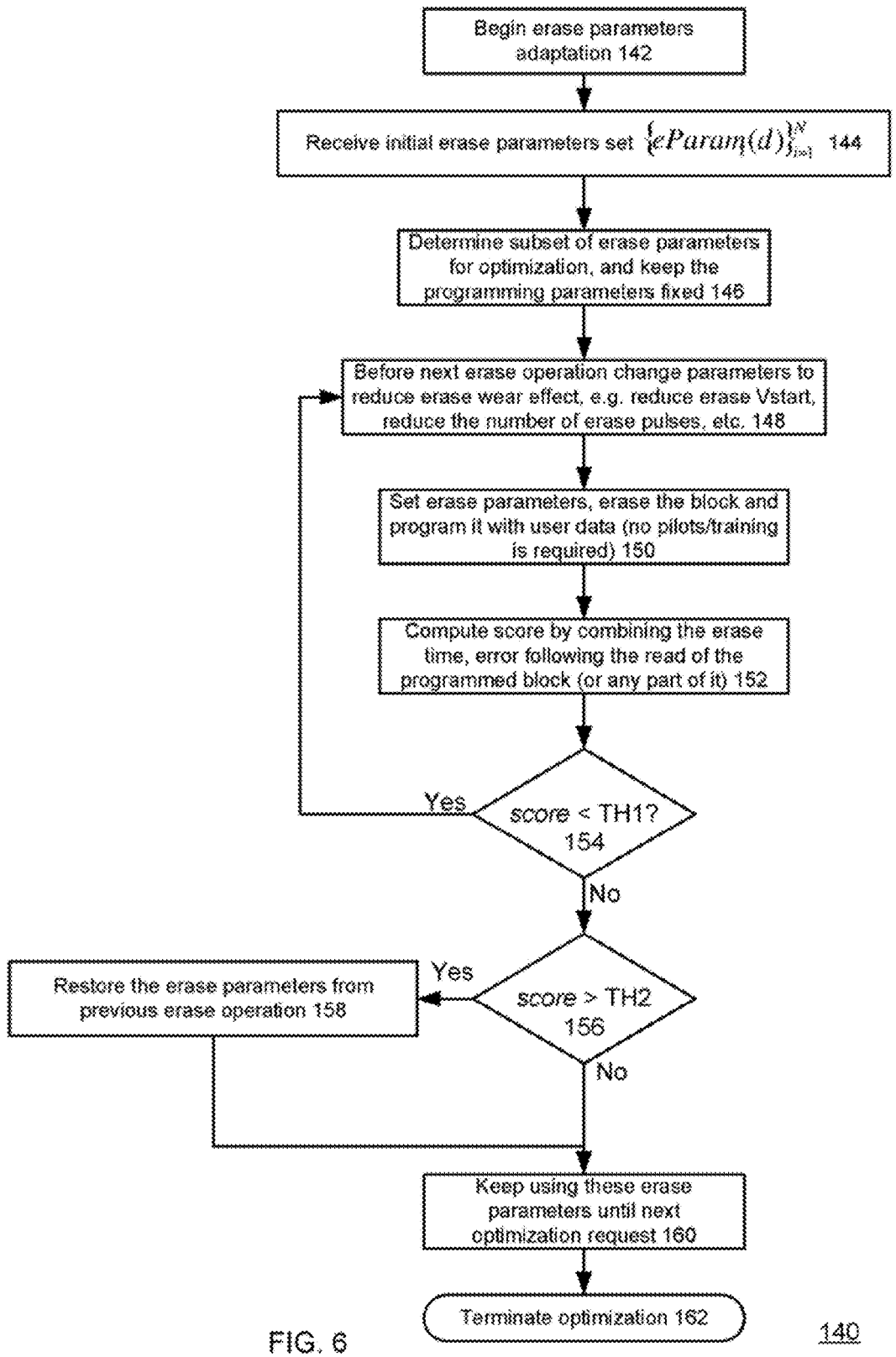

FIG. 6 illustrates an erase parameters optimization method 140 according to an embodiment of the invention.

The erase parameters optimization method 140 may include stages 142, 146, 148, 150, 152, 154, 156, 158, 160 and 162.

Method 140 starts by receiving an initial set of erase parameters and beginning the erase parameter adaptation (142).

This is followed by determining (146) a subset of the erase parameter set to be optimized and keeping the programming parameters fixed.

This is followed by changing, before next erase operation, one or more erase parameters of the sub-set that should be optimized (148) to reduce erase wear effect.

Non-limiting example changes may include at least one of: reducing the erase start voltage, reducing the erase voltage step up value, increasing the erase verify level, or increasing the threshold of number of unverified cells (which is the number of non-erased cells for which erase can be terminated).

This is followed by using the erase parameters to erase a block of flash memory cells and program to the erase block user information (150).

When reading content of blocks programmed after erasing with the modified parameters, the statistics of average BER and maximal BER and erase time and program time are collected and can be used to compute a score (152), possibly like the score computed in (1).

If the score is smaller than a lower threshold (154), i.e. score<TH1, this means that the erase parameters may be further changed to reduce wear effect, and on the next erase operation (148), these parameters may be changed again, according to same guidelines provided earlier.

If the score exceeds the first threshold it is compared to a second threshold (156).

If the score is within an desired range, i.e. TH2>score≥TH1, then the erase parameters optimization method may terminated (162) after the erase parameters may be saved (160) and used within the cycle range, or up to a new optimization method trigger.

If the score exceeds a high threshold, i.e. score≥TH2, which means that programming ended up with too many induced errors, then the valid erase parameters should be set (158) to those that were used in previous erase operation.

Optionally, a programming optimization method may be attempted, according to embodiments for programming optimization method disclosed in this invention.

Once programming optimization method successfully terminated the programming score is compared again with TH2, and if smaller the last erase parameters are used.

Otherwise, or if no program optimization method follows, then the erase parameters from previous erase parameters modification is set and further erase operations are carried out with the last erase parameters saved.

Figure 7:
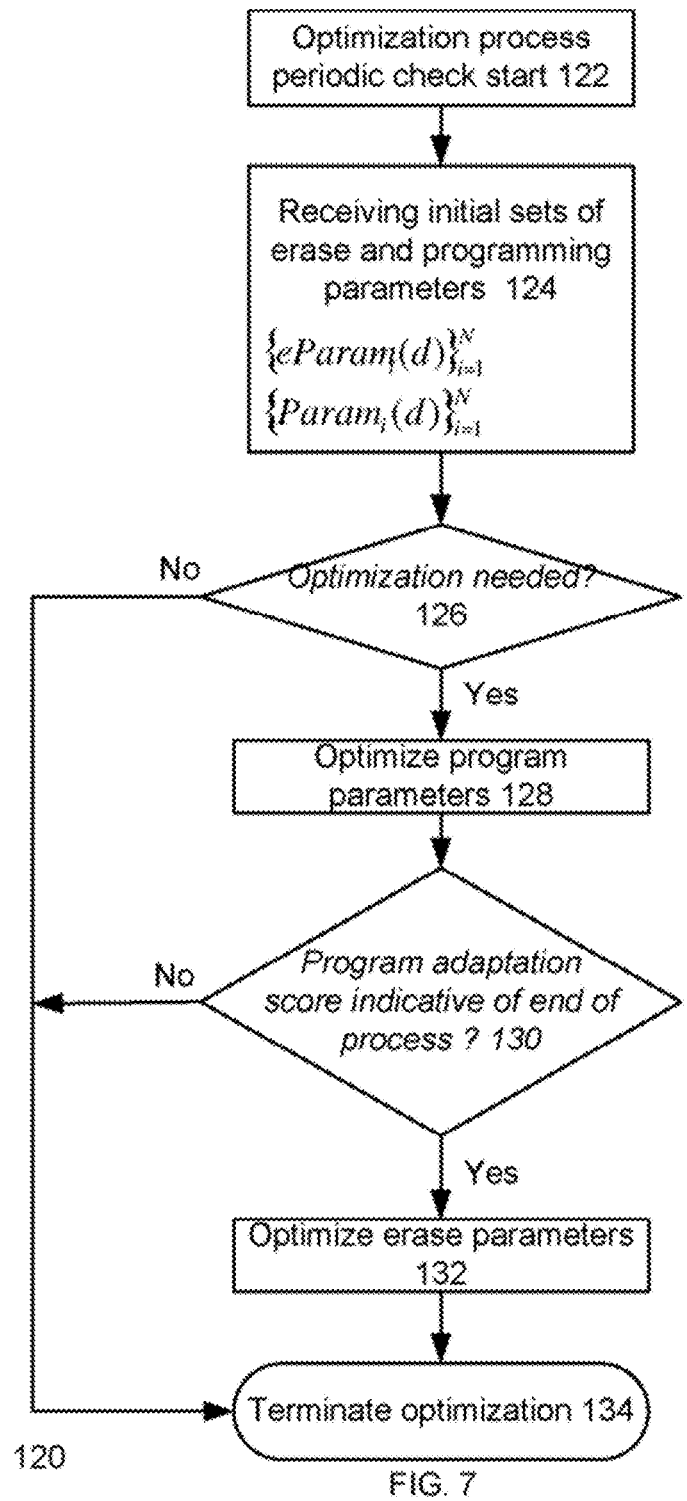

FIG. 7 illustrates an erase and programming parameters optimization method 120 according to an embodiment of the invention.

Method 120 may be targeted to minimize the wear effect involved in the erase operation, while allowing a sufficient quality of program results.

This optimization method serves to maximize the flash memory device supported endurance.

At the beginning (may be initialed periodically—122) of the erase optimization method an initial set of programming and erase parameters is received (124). These initial sets of programming and erase parameters can be different for every P/E cycle range, like demonstrated in Tables 1, and 2.

The process proceeds to a determination (126) whether there is a need to perform the optimization method. If the answer is positive then the programming parameters are modified (during a programming parameter optimization 128). This may be followed by checking if a programming adaptation value is indicative that the programming parameters optimization should end (130) and jumping to stage 126 of not. Else—the process continues to stage 132 of erase parameter optimization. This may be followed by end of process stage 134.

FIG. 7 illustrates a flow of an erase and program optimization method, which have complimentary contribution to the endurance maximization over the flash memory device life span. Each of the optimization methods (for erase and program) may be done separately, or jointly. The following figure describes a side by side erase and program optimization method.

According to embodiments of the invention, the process may start periodically, for every cycle range, or may be triggered by a score which is computed following host read commands. That is, the score occasionally computed after every read operation. If the score is larger than a certain threshold, then a process of optimization method may take place.

According to some embodiments of the invention, if an optimization method is needed, the first process includes optimizing the programming parameters, such that the score becomes smaller. A smaller score expresses a more robust programming result, which may have less read errors after programming by obtaining a smaller STD of the voltage threshold distribution per level, or by having a greater spacing between the program levels.

The program adaptation may be done over a sequence of programming operations done on possibly multiple different blocks with approximately the same effective cycle count or wear level.

Once the programming optimization method is complete, the score which results from the optimization method is compared with a threshold. If the score is smaller than the threshold, than the current optimization method may terminate. Otherwise, an erase optimization method takes place.

During the erase optimization method, the erase parameters are changed that that the programming may end up with a smaller STD and or a smaller read RBER. This may include for example using more erase pulses, and/or increasing the erase start voltage, and other strategies according to embodiments of this invention.

The erase adaptation may be done over a sequence of erase operations done on possibly multiple different blocks with approximately the same effective cycle count or wear level.

Figure 8:
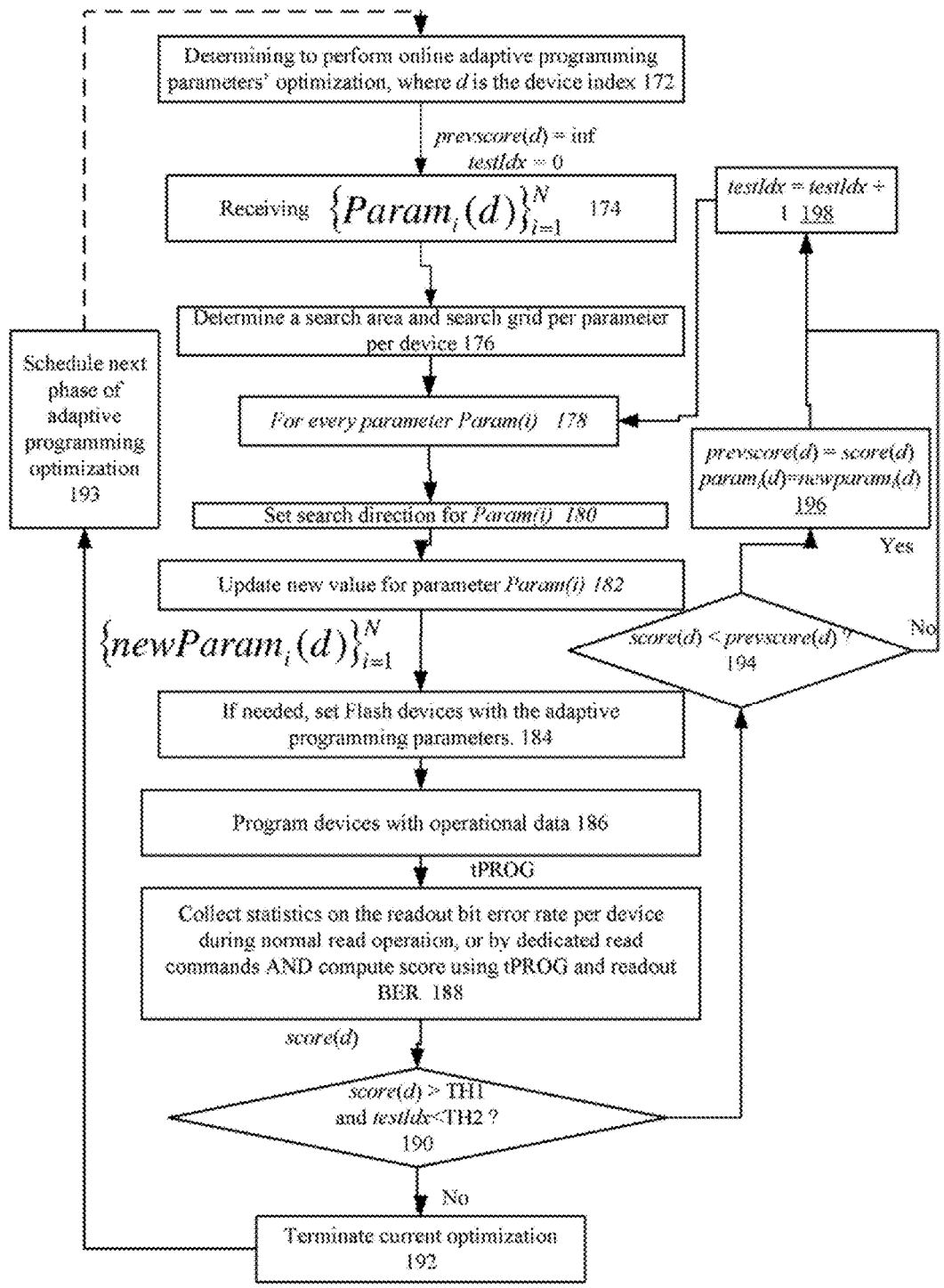

FIG. 8 illustrates a method 170 for adaptive programming optimization method according to an embodiment of the invention.

The optimization method (170) begins by determining (172) to perform an optimization method of programming parameters on a flash memory device denoted d and receiving (174) a set of programming parameters of this device that include N programming parameters. The parameters of device d can be referred to as param(i,d) or simply param(i), index i ranges between 1 and N. The set of programming parameters may be either pre-determined per cycle range, or may be the last set used following the previous optimization method.

Stage 172 may also include determining a subset of parameters which will be subject for optimization. For example, it may be required that the programming verify levels remain unchanged during the optimization method, while parameters like the programming start voltage and the program voltage step will be part of the optimization method.

This may be followed by determining (176) a search area and a search grid for each parameter—this may include determining, for each parameter to be evaluated a step and range values. This may be either pre-configured, or dynamically set according to the sensitivity of the programming result to the change in a parameter. Usually, the range will be set such that the parameters will not be set to values which might have a destructive impact on the programming result. That is, there are different combinations of parameter values or extreme valid values for different parameters which may lead to a failure in the programming, meaning that the data programmed cannot be reliably read after programming. Such scenarios are avoided by limiting the span of parameters change in advance, according to the embodiments of this invention.

The parameters may be ordered (according to values of index i) for the optimization method. For every parameter (178) the initial search direction is set (180), and a single change step (182) is applied (the parameter may be changed with a subset of dependent parameters, or may be a single parameter). The modified parameters set is set to the flash memory device.

The next step is to program one or more blocks of the flash memory device (186) with similar cycle counts using this set of parameters. The flash memory device is programmed with operational data, without using any pilots. Then the programming results are evaluated by collecting (188) the RBER following programming of the block and using the tPROG and other statistics, a score is computed to evaluate the benefit of the step.

If (190) the score is bigger than a threshold, i.e. score(d)>TH1, and the number of tests did not exceed a maximum the new score (194 "score (d)<prevscore(d)") is compared with a previous score. Else the process may terminate (192). If the new score is smaller, then the new parameters are saved (196—"prevscore(d)=score(d), param(i,d)= newparam(i,d)"), and another step of modification (198) of the parameters of the subset in the same direction will be done. In any case the test index is incremented (198) before performing a new optimization iteration. Otherwise, the parameter is not saved, and the optimization method can take place in the opposite direction, or a different parameters subset can be chosen, i.e. change the parameters election index i.

Once a sufficiently small score is obtained, or the number of tests exceeded a threshold, the optimization method is terminated (192) and a new optimization method is scheduled (193).

According to an embodiment of this invention, if the optimization method terminated with a score which is not smaller than TH1, then an addition optimization method with different initial conditions may be carried out, in the same lines.

According to an embodiment of this invention, the thresholds configuration may be changed according to the current endurance. That is, the higher the P/E cycles, or effective cycling, the higher we may want to set the score threshold.

According to an embodiment of this invention the score thresholds and functions may change as a function of the P/E cycles. For example, the weights attributed with different metrics used to calculate the score may change with the P/E cycles. E.g. with higher P/E cycles, lower weights to tProg may be used as it may be less important if it takes longer to program at high P/E cycles.

Figure 9:
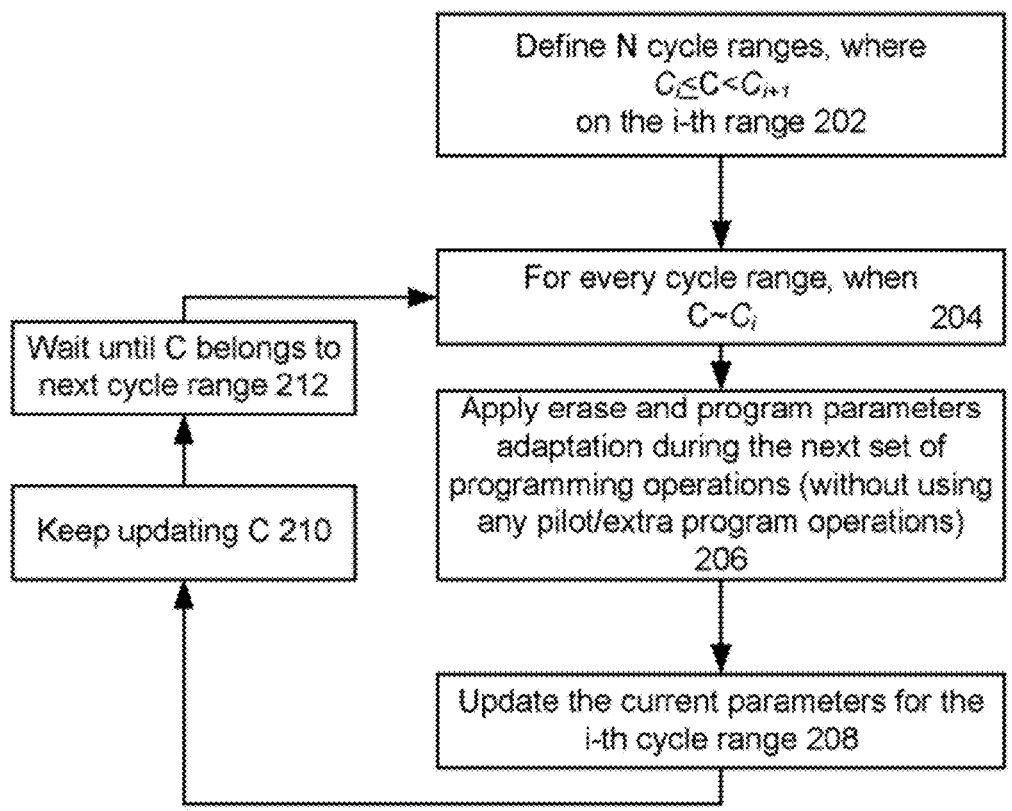

FIG. 9 illustrates method 200 for a P/E cycle count triggered parameter optimization according to an embodiment of the invention.

It is assumed that N program/erase cycle count ranges are defined or received (202). Stage may include defining or receiving N sub-ranges of wear levels.

These can be either following a counter of P/E cycles, or defined as effective cycle count ranges, where the effective number of cycles is estimated from programming results such as RBER following programming with known parameters, and/or by measuring its corresponding tPROG.

Every time the effective cycle count of a set of blocks reaches a new cycle range (204—current PIE cycle count reaches a first P/E cycle count value of a new P/E range), an optimization method of erase and programming parameters is carried out (206) and at least some evaluated parameters and updated (208).

During each program erase cycle the P/E counter is updated (210) and compared to boarders of a new P/E cycle count range (212) before jumping to stage 204.

This optimization method may be done separately per flash memory device.

According to an embodiment of the invention it may use as initial conditions for optimization, a set of parameters which may be either pre-determined per cycle range, or may be the last set obtained by the previous optimization method.

Figure 10:
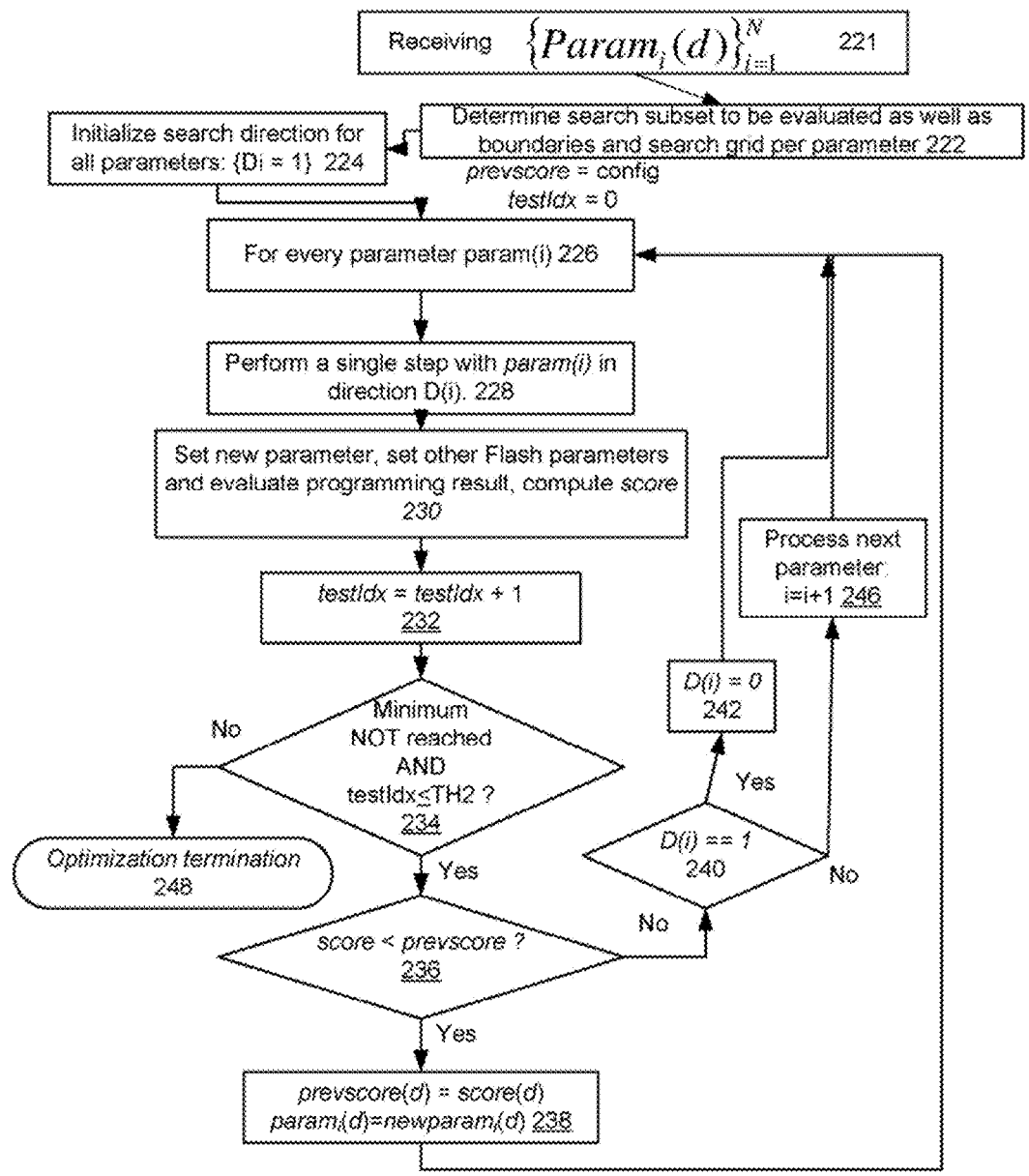

FIG. 10 illustrates method 220 for a programming optimization according to an embodiment of the invention.

The optimization method (220) may begin with receiving (221) a set of programming related parameters. The set of parameters may be either pre-determined per cycle range, or may be the last set used following the previous execution of the optimization method.

The receiving may be followed by determining (222) the subset of parameters which will be subject for optimization. For example, it may be required that the programming verify levels remain unchanged during the optimization method while parameters like the programming start voltage and the program voltage step will be part of the optimization method.

For the set of parameters for optimization, a step and range values are determined (222) per parameter. This may be either pre-configured, or dynamically set according to the sensitivity of the programming result to the change in a parameter.

Usually, the range will be set such that the parameters will not be set to values which might have a destructive impact on the programming result. That is, there are different combinations of parameter values or extreme valid values for different parameters which may lead to a failure in the programming, meaning that the data programmed cannot be reliably read after programming. Such scenarios are avoided by limiting the span of parameters change in advance, according to the embodiments of this invention.

The parameters are ordered for the execution of the optimization method. For every parameter (226) the initial search direction is set {D(i)=1} (224), and a single change step is applied (228)—the parameter may be changed with a subset of dependent parameters, or may be a single parameter. The modified parameters set is to be applied to the flash memory device. The value of D(i) indicates the search direction for the i-th parameter.

The next step is to program (230) block(s) with similar cycle counts using this set of parameters. The flash memory device may be programmed with operational data, without using any pilots. Then the programming results are evaluated (230) by collecting the RBER following programming of the block and using the tPROG and other statistics, a score is computed to evaluate the benefit of the step. The test iteration counter is increased (box 232—"testIdx=testIdx+1").

The method 220 then continues to text (234) if a minimum has been reached and whether the number of tests (test iterations) reached a maximum allowable value (234).

If the sequence of tests yielding a score per test reached a minimum, in the lines following a steepest-decent search for the minimum, or the number of evaluations exceeded a maximum then the optimization method may terminate (248).

Otherwise, if the number of tests did not exceed a maximum, and a minimum was not yet obtained, the new score is compared with a previous score (236). If the new score is smaller, then the new parameters are saved (238), and another step of modification to the parameter subset param(i) in the same direction will be done (226).

Otherwise, the parameter is not saved, and the param(i) optimization method, if Di=1, can take place in the opposite direction, else a different parameter subset can be chosen, i.e. change the parameters election index i: i=i+1 (248).

When D(i) is 1 in stage 240 it means that the search direction should be changed and then D(i) is set to 0. The next time we reach stage 240, D(i) is 0, and therefore the method will continue from stage 240 to stage 246 which increases the parameter pointer, i.e. optimization continues with another parameter.

Once a sufficiently small score is obtained, or the number of tests exceeded a threshold, the optimization method is terminated.

According to an embodiment of this invention, if the optimization method terminates with a score which is not smaller than TH1, then an addition optimization method with different initial conditions may be carried out, according to the same guidelines.

According to an embodiment of this invention, the thresholds may be changed according to the current endurance. That is, the higher the P/E cycles, or effective cycling, the higher we may want to change the thresholds.

Figure 11:
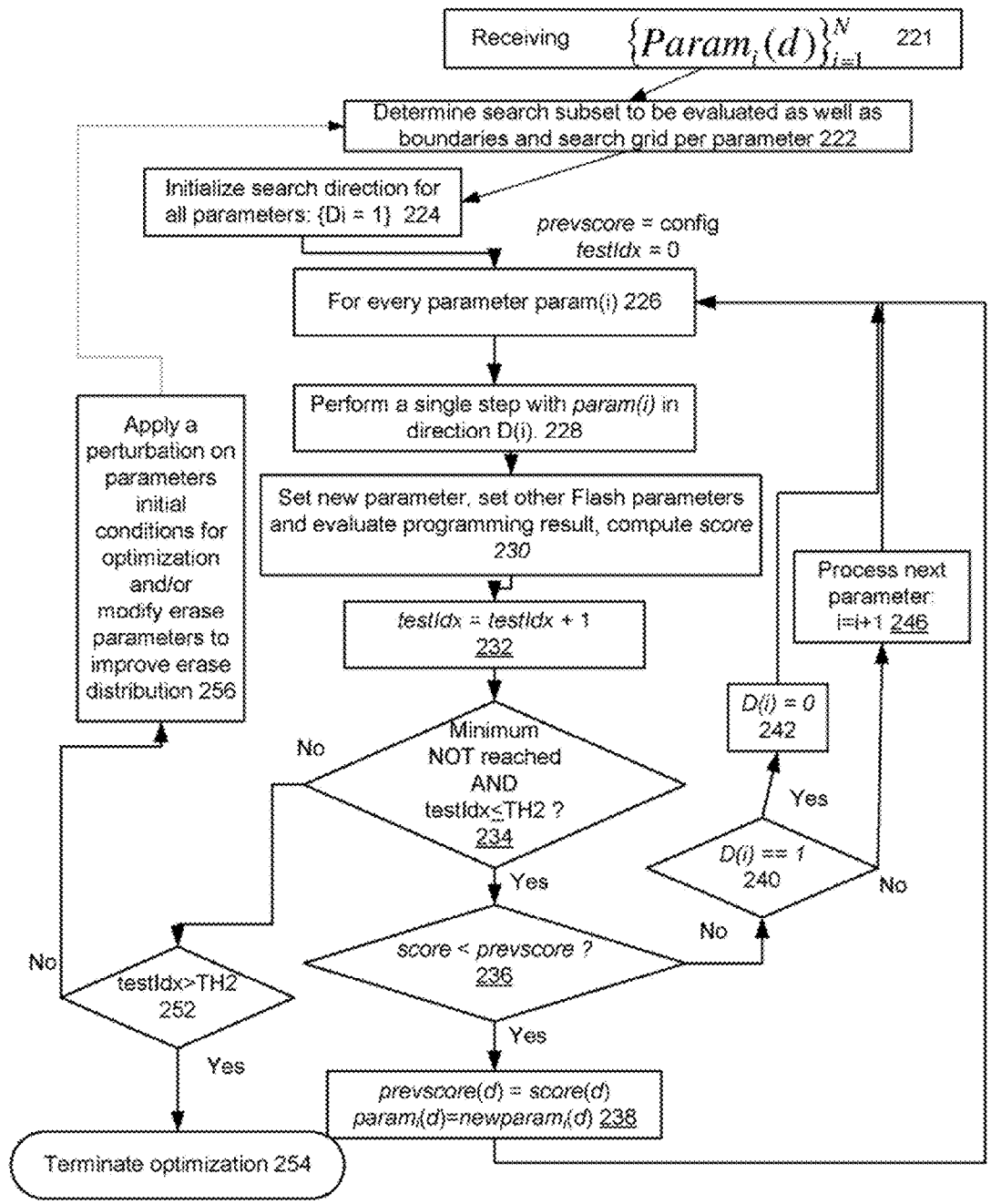

FIG. 11 illustrates an optimization method 250 according to an embodiment of the invention.

Optimization method 250 differs from method 220 of FIG. 10 by its termination stages.

If the testing (234, 252) indicates that a minimum has not been reached and although the number of tests (test iterations) reached maximum allowable value, the method 250 continues to perform (256) a random/deterministic perturbation on the initial parameters. This perturbation may comply with the optimization search rules on the parameters set (for example—limiting the values in order to prevent a destructive programming process), as otherwise, these parameters might lead to destructive programming results.

Instead of this random perturbation (256), or in addition, an erase optimization method (not shown) may be carried out to provide a smaller effective score for the current parameters. Once, this is done, there is a better chance to succeed in the next programming optimization method.

Stage 256 may be followed by stage 252.

Figure 12:
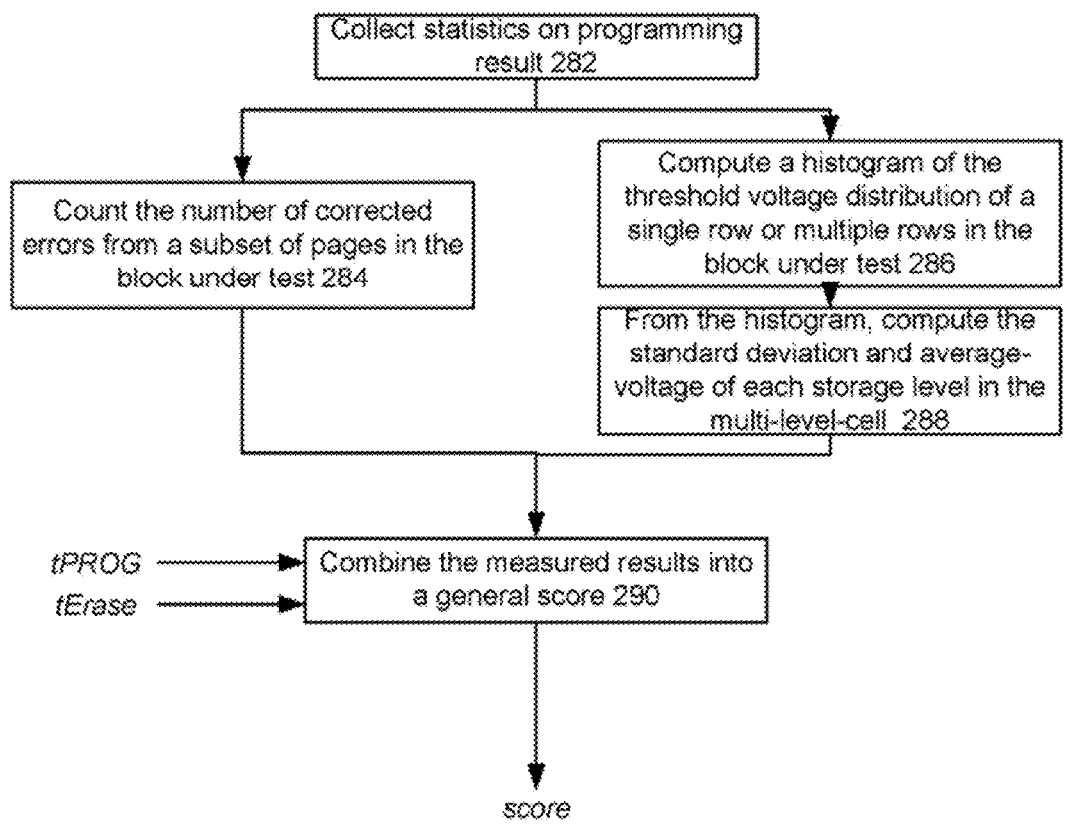

FIG. 12 illustrates a method 280 for computing a score for evaluating the programming and/or erase parameters, according to an embodiment of the invention.

The programming and/or erase adaptation may be done without adding pilot/training data to the programming operation. As indicated in previous figures—on a new programming command from the application, the controller may check if adaptation of the erase/programming parameters is required. The check may include using a score.

The calculation of a score may start by collecting statistics on programming results (282) related to a group of flash memory cells. It is assumed, for brevity of explanation that the group of flash memory cells forms a block.

Stage 282 may be followed by counting (284) the number of corrected errors from a subset of pages of the block and computing (286) a threshold voltage distribution (for example—generating a histogram) of a single row or multiple rows of the block. The computing (286) can be followed by computing (288), based upon the histogram the standard deviation and average-voltage of each storage level of the flash memory ells. The outputs of the computing (286) and the counting (284) can be combined (290) with average programming operation duration and average erase operation duration to provide a score.

For example, a read operation generated bit error rate (BER) that can be gathered from a read operation that follows erase and programming operations can be obtained. The raw bit error rate (RBER) can be combined with programming time and erase time to provide a common score. The RBER is the bit error rate of the read from the Flash device before applying the error correction coding. It is expected that post ECC all errors will be corrected, and this is actually how also it is possible to compute the number or errors.

Furthermore, the RBER may be measured on different pages. The controller may take an average value, and max BER value, over a subset of programmed pages. The score may be for example a weighted sum of the mean BER and the maximal BER, i.e.

$$\text{score} = \beta \cdot \bar{e} + (1-\beta) \cdot \max(e) + M \cdot 1(Tprog > THp) + M \cdot 1(Terase > THe)$$

Where $0 \leq \beta \leq 1$ is a weighting factor of the BER vector e, and $\bar{e}$ is the average BER and max(e) is the highest measured readout BER of the vector e.

The parameter M is a penalty factor which may be added to the score in case of constraint violation of the programming time Tprog or the erase time Terase.

In addition, the score may benefit from including, if available, a voltage threshold histogram processed data. For example, a histogram may be created during activation of a DSP for finding the optimal read thresholds. From such a histogram of the voltage threshold distribution it may be possible to estimate/approximate the STD of each program level. The average STD over all levels, and the maximal STD, can be combined in the resulting score in the following way $$\text{score} = \alpha[\beta \cdot \bar{e} + (1-\beta) \cdot \max(e)] + (1-\alpha)[\gamma \cdot \overline{STD} + (1-\gamma) \cdot \max(STD)] + M \cdot 1(Tprog > THp) + M \cdot 1(Terase > THe)$$

Where $0 \leq \alpha \leq 1$, $0 \leq \beta \leq 1$, $0 \leq \gamma \leq 1$ are weighting factor of the BER vector e, and $\bar{e}$ is the average BER and max(e) is the highest measured readout BER, and the STD measured from the voltage threshold histogram. The parameter M is a penalty factor which may be added to the score in case of constraint violation of the programming time Tprog or the erase time Terase.

Figure 13:
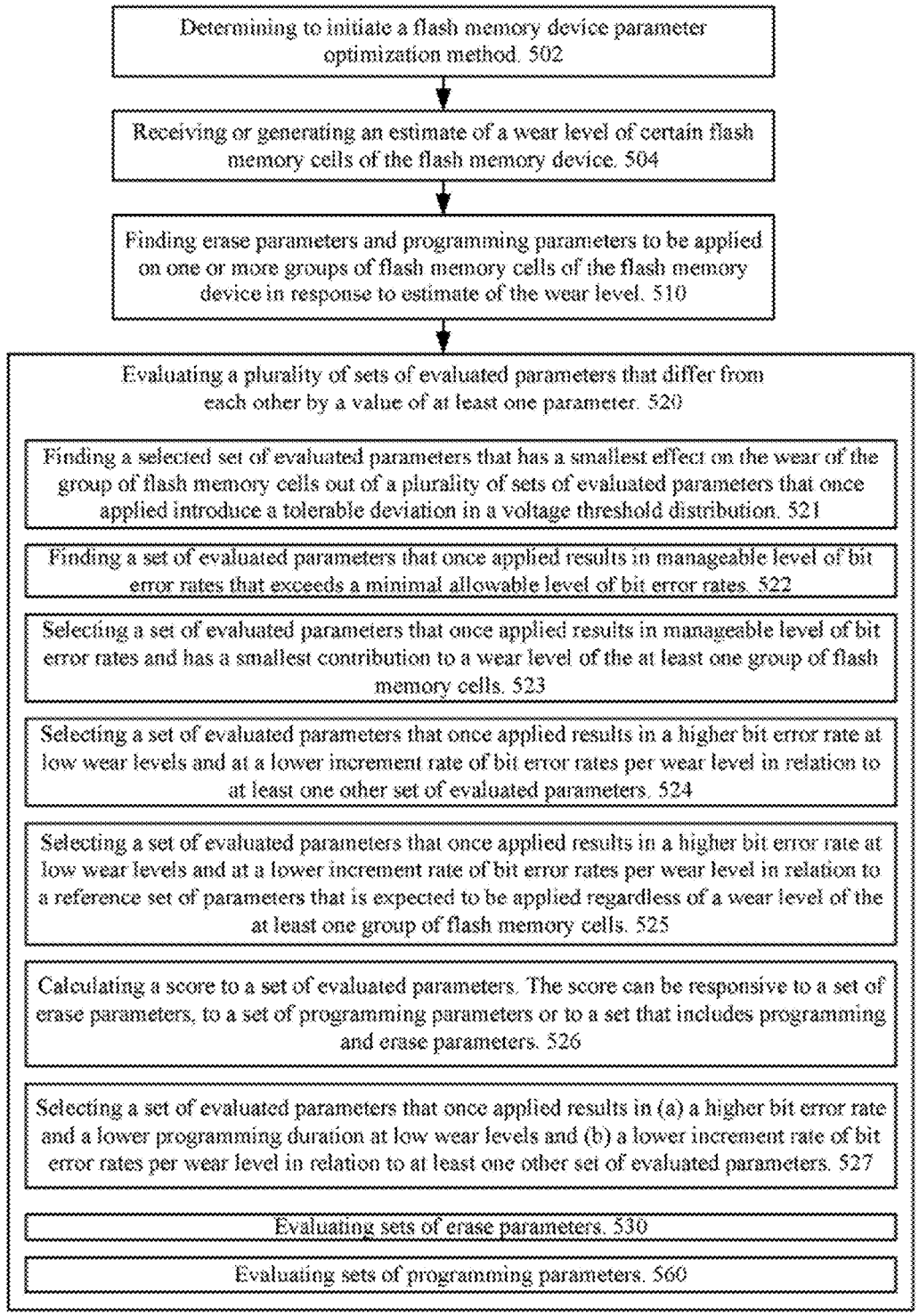

FIGS. 13-15 illustrate method 500 according to various embodiments of the invention. Especially, FIGS. 14 and 15 illustrate stages 530 and 560 of method 500 according to an embodiment of the invention.

Method 500 is aimed for flash memory device parameter optimization.

Method 500 may start by stage 502 of determining to initiate a flash memory device parameter optimization method.

This determination can be responsive to an event, can be executed in a periodic manner, in a random or pseudo-random manner.

An event can be an occurrence of a certain change in a wear level of certain flash memory cells, reaching a certain wear level, entering a sub-range of wear levels, an occurrence of a programming failure, an occurrence of an erase failure, a detection of certain levels of bit error rates, and the like.

A non-limiting example of sub-ranges of wear levels are illustrated in tables 1 and 2—each sub-range of wear levels is associated with a range of P/E cycles counts—each row of these tables represents a different sub-range of wear levels. It is noted that the wear level can be evaluated in other manners and in this case the P/E cycle count does not define the sub-ranges.

Stage 502 can determine to initiate the optimization method once per one or more sub-ranges of wear levels, multiple times per one or more sub-ranges of wear level, skip the optimization per one or more sub-ranges of wear levels and the like.

According to an embodiment of the invention the optimization is executed one the wear level first enters (or proximate to the entering to) a new sub-range of wear levels. It is assumed that at this point the state of the state of the flash memory cells can be regarded as the best within the sub-range.

Stage 502 may be followed by stage 504 of receiving or generating an estimate of a wear level of certain flash memory cells of the flash memory device. These certain flash memory cells can be a page, multiple pages, an erase block, multiple erase block and the like.

Stage 504 may be followed by stage 510 of finding erase parameters and programming parameters to be applied on one or more groups of flash memory cells of the flash memory device in response to estimate of the wear level.

The finding process may include finding erase parameters and/or programming parameters. The finding process (510) may include stage 520 of evaluating a plurality of sets of evaluated parameters that differ from each other by a value of at least one parameter.

Each one of the plurality of sets of evaluated parameters may include comprise at least one out of a set of erase parameters and a set of programming parameters. Accordingly, stage 510 may include evaluating sets of programming parameters, programming sets of erase parameters or evaluating a combination thereof.

Stage 520 may include stages 530 and 560.

Stage 520 may also include stages such as stages 521-527 that can be shared between stages 530 and 560.

Any of the stages (521-527) is applicable to the finding of erase parameters, programming parameters or both erase and programming parameters.

Stage 521 may include finding a selected set of evaluated parameters that has a smallest effect on the wear of the group of flash memory cells out a plurality of sets of evaluated parameters that once applied introduce a tolerable deviation in a voltage threshold distribution.

Stage 522 may include finding a set of evaluated parameters that once applied results in manageable level of bit error rates that exceeds a minimal allowable level of bit error rates.

Stage 523 may include selecting a set of evaluated parameters that once applied results in manageable level of bit error rates and has a smallest contribution to a wear level of the at least one group of flash memory cells.

Stage 524 may include selecting a set of evaluated parameters that once applied results in a higher bit error rate at low wear levels and at a lower increment rate of bit error rates per wear level in relation to at least one other set of evaluated parameters. FIG. 10 provides an example of the performances of a prior art set of parameters versus a set of parameters selected according to an embodiment of the invention.

Stage 525 may include selecting a set of evaluated parameters that once applied results in a higher bit error rate at low wear levels and at a lower increment rate of bit error rates per wear level in relation to a reference set of parameters that is expected to be applied regardless of a wear level of the at least one group of flash memory cells.

Stage 526 may include calculating a score to a set of evaluated parameters. The score can be responsive to a set of erase parameters, to a set of programming parameters or to a set that includes programming and erase parameters.

Stage 527 may include selecting a set of evaluated parameters that once applied results in (a) a higher bit error rate and a lower programming duration at low wear levels and (b) a lower increment rate of bit error rates per wear level in relation to at least one other set of evaluated parameters.

Stage 530 includes evaluating sets of erase parameters.

Stage 530 may include stages 531-539.

Stage 531 may include evaluating sets of erase parameters by erasing different groups of flash memory cells of the flash memory device that have substantially a same weal level. Thus—instead repetitively erasing the same group of flash memory cells and thus performing erase operations that are dedicated to the evaluation of the erase parameter, the erasing can be executed on different groups of flash memory cells—especially those who were already scheduled to be erased—thus not erase overhead is required.

Nevertheless—even stage 531 can include performing one or more erase operations that are dedicated for the evaluation of the erase parameters.

Stage 553 may include finding a set of erase parameters that minimize a formation of traps.

Stage 534 may include finding a set of erase parameters that minimize a wear of the group of flash memory cells resulting from erase processes.

Stage 535 may include finding a set of erase parameters that includes at least one of a start erase voltage, a number of maximal allowable erase pulses, an erase pulse width, an erase voltage step and erase level. Especially, and as illustrated in table 1, stage 535 may include finding a set of erase parameters that includes at least one of a minimal start erase voltage, minimal number of maximal allowable erase pulses, minimal erase pulse width, minimal erase voltage step and maximal erase level.

Stage 536 may include evaluating sets of evaluated parameters wherein each set of erase parameters is sub-optimal in a context of voltage threshold distribution. Sub-optimal voltage threshold distribution can include lobes of width than exceeds a minimal obtainable width, lobes that are more close to each other than what could have been obtained with an optical voltage threshold distribution and the like.

Stage 537 may includes finding a set of erase parameters in response to a duration attribute of erase operations to be obtained when applying the set of erase parameters. The duration attribute can be an average duration of erase operation, a weighted sum of durations erase operations and the like.

Stage 537 may include ignoring sets of erase parameters that once applied result in an average duration of erase operations that exceeds an erase duration threshold.

Stage 537 may include changing a value of the erase duration threshold in response to values of the wear level. Higher wear levels may increase the erase duration threshold.

Stage 538 may include calculating a score per each set of erase parameter. The score is calculated during the evaluation and assist in selecting a selected set of erase parameters.

The score of a set of erase parameter may be responsive to read errors resulting from a read operation that follows a programming operation that in turn follows the erase operation.

The score of each set of erase parameters can be responsive to at least one value of at least one parameter of the set of erase parameters.

The score of each set of evaluated parameters can be response to the wear level.

Sub-ranges of higher order are associated with higher wear levels. According to an embodiment of the invention stage 539 may include increasing at least one parameter out of a start erase voltage, a number of maximal allowable erase pulses, an erase voltage step and erase pulse width with an increase of an order to the sub-range. A non-limiting example is provided in table 1.

Stage 540 may include finding a set of erase parameters that once applies minimizes a wear level increment resulting from an erase operation.

Stage 543 may include performing erase operations, during the evaluation of erase parameters, while using "normal" (not test-dedicated) erase parameters. Accordingly, stage 573 may include erase parameters that are applied during erase operations of information that is not related to the finding of the erase parameters and the erase parameters.

Stage 560) includes evaluating sets of programming parameters. Stage 560 may include stages 561-569.

Stage 560 may include stage 561 of programming different groups of flash memory cells of the flash memory device that have substantially a same weal level.

Thus—instead repetitively programming the same group of flash memory cells and thus performing programming operations that are dedicated to the evaluation of the programming parameter, the programming can be executed on different groups of flash memory cells—especially those who were already scheduled to be programmed—thus not programming overhead is required.

Nevertheless—even stage 561 can include performing one or more programming operations that are dedicated for the evaluation of the programming parameters.

In order not to corrupt programmed information (or at least reduce the chances of such a corruption) the values of the evaluated parameters (erase and/or programming parameters) can be limited—such as to belong to only within sub-ranges of possible ranges of values of the evaluated parameters. This is illustrated by stage 532 and 562 of limiting the values of the erase or programming parameters (respectively) to sub-ranges.

Stage 565 may include finding a set of programming parameters that includes at least one of a start programming voltage, a number of maximal allowable programming pulses, a programming voltage step, a programming pulse width and a program bias voltage. Especially, and as illustrated in table 2, stage 565 may include finding a set of programming parameters that includes at least one of a maximal start programming voltage, minimal number of maximal allowable programming pulses, minimal programming voltage step, minimal programming pulse width and minimal program bias voltage.

Stage 567 may includes finding a set of programming parameters in response to a duration attribute of programming operations to be obtained when applying the set of programming parameters. The duration attribute can be an average duration of programming operation, a weighted sum of durations programming operations and the like.

Stage 567 may include ignoring sets of programming parameters that once applied result in an average duration of programming operations that exceeds an programming duration threshold.

Stage 567 may include changing a value of the programming duration threshold in response to values of the wear level. Higher wear levels may increase the programming duration threshold.

Stage 568 may include calculating a score per each set of programming parameter. The score can be calculated during the evaluation and can assist in selecting a selected set of programming parameters.

The score of a set of programming parameter may be responsive to read errors resulting from a read operation that follows a programming operation that was executed by applying programming parameters of the set of the evaluated parameter.

The score of a set of programming parameters can be responsive to at least one value of at least one parameter of the set of evaluated parameters.

The score of a set of programming parameters can be responsive to the wear level.

According to an embodiment of the invention stage 569 may include increasing at least one parameter out of a number of maximal allowable programming pulses, programming voltage step, programming window, program pulse width and program bias voltage with an increase of an order to the sub-range. A non-limiting example is provided in table 2.

Stage 570 may include finding a set of programming parameters that once applied minimized a wear level increment resulting from a programming operation.

Stage 571 may include finding a set of programming parameters of values that once applied will not result in a corruption of data programmed to the flash memory device.

Stage 572 may include calculating a score of a set of programming parameters in response to statistical attribute of the voltage threshold distribution resulting from applying the set of programming parameters.

Stage 573 may include performing programming operations, during the evaluation of programming parameters, while using "normal" (not test-dedicated) programming parameters. Accordingly, stage 573 may include programming parameters that are applied during programming operations of information that is not related to the finding of the erase parameters and the programming parameters.

Stage 574 may include repetitively programming same information to multiple groups of flash memory cells while applying different sets of programming parameters that differ from each other. These different groups may differ from each other by their wear level.

Stage 575 may include repetitively programming the same information to multiple groups of flash memory cells if a probability of a programming operation failure exceeds a threshold.

Stage 576 may include repetitively programming same pilot information to multiple groups of flash memory cells while applying different sets of programming parameters that differ from each other.

Stage 577 may include finding a set of programming parameters while applying a steepest decent algorithm. Non-limiting examples of such algorithm are illustrated in FIGS. 8, 10 and 11.

Figure 16:
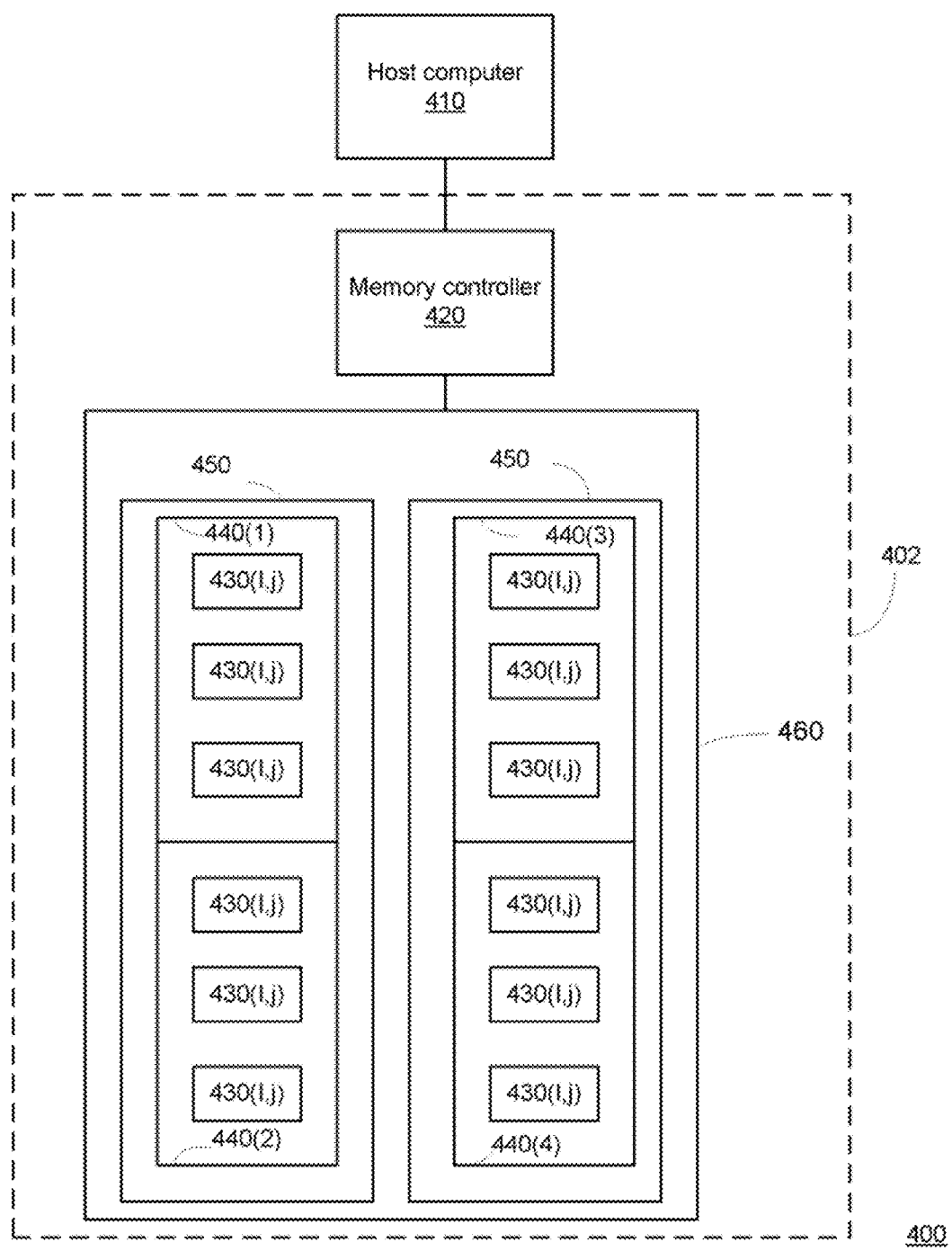
FIG. 16 illustrates a device according to an embodiment of the invention.

Any of the methods mentioned above can be executed by a memory controller. FIG. 16 illustrates a system 400 and a sub-system 402 according to an embodiment of the invention.

The sub-system 402 includes a flash memory controller 420 and a flash memory device 460. The flash memory device 460 is illustrated as having two flash memory dies 450(1) and 450(2), that include blocks 440(1)-440(4) respectively. Each block may include multiple pages such as flash memory pages 430(i,j). The flash memory controller 420 is coupled to host controller 410 and to the flash memory device 460. The number of pages, dies, and blocks may differ from those illustrated in FIG. 16.

The flash memory controller 420 can include a read circuit 421, a write circuit 422, an erase circuit 423, and parameter finder 423 for finding erase parameters and programming parameters. The read circuit 421 can read from the flash memory device 460. The write circuit 422 can write (perform programming operations) to the flash memory device 460. The erase circuit 423 may be arranged to perform erase operations of erase blocks of the flash memory device. The parameter finder 424 can find programming parameters, erase parameters or a combination of both. The parameter finder 424 may be arranged to execute all stages of any methods mentioned in the specification except read, write and erase operations that are executed by circuits 421, 422 and 423. The parameter finder 424 control the operations of circuits 421-423 but this is not necessarily so.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media nonvolatile memory storage media including semiconductor-based memory units such as FLASH memory, EEPROM, EPROM. ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A non-transitory computer readable medium for flash memory device parameter optimization, the non-transitory computer readable medium stores instructions for: receiving or generating an estimate of a wear level of at least one group of flash memory cells of the flash memory device; finding erase parameters and programming parameters to be applied on one or more groups of flash memory cells of the flash memory device in response to estimate the wear level;

wherein the finding comprises evaluating a plurality of sets of evaluated parameters that differ from each other by a value of at least one parameter, wherein each one of the plurality of sets of evaluated parameters comprise at least one out of a set of erase parameters and a set of programming parameters;

wherein the non-transitory computer readable medium further stores instructions for executing at least one out of:

(a) ignoring sets of erase parameters that once applied result in an average duration of erase operations that exceeds an erase duration threshold, (b) ignoring sets of programming parameters that once applied result in an average duration of programming operations that exceeds a programming duration threshold, (c) selecting a set of evaluated parameters that once applied results in a higher bit error rate at low wear levels and a lower increment rate of bit error rates per wear level in relation to at least one other set of evaluated parameters, (d) selecting a set of evaluated parameters that once applied results in (i) a higher bit error rate and a lower programming duration at low wear levels and (ii) a lower increment rate of bit error rates per wear level in relation to at least one other set of evaluated parameters, and (e) selecting a set of evaluated parameters that once applied results in a higher bit error rate at low wear levels and at a lower increment rate of bit error rates per wear level in relation to a reference set of parameters that is expected to be applied regardless of a wear level of the at least one group of flash memory cells.

2. The non-transitory computer readable medium according to claim 1, that stores instructions for evaluating sets of erase parameters by erasing different groups of flash memory blocks of the flash memory device that have substantially a same weal level.

3. The non-transitory computer readable medium according to claim 1, that stores instructions for evaluating sets of programming parameters by programming different groups of flash memory blocks of the flash memory device that have substantially a same weal level.

4. A The non-transitory computer readable medium according to claim 1, wherein values of the evaluated parameters of each of the different sets of evaluated parameters are within sub-ranges of possible ranges of values of the evaluated parameters.

5. The non-transitory computer readable medium according to claim 1, that stores instructions for finding a set of evaluated parameters that minimize a formation of traps.

6. The non-transitory computer readable medium according to claim 1, that stores instructions for finding a set of erase parameters that minimize a wear of the group of flash memory cells resulting from erase processes.

7. The non-transitory computer readable medium according to claim 1, that stores instructions for finding a set of erase parameters that comprises at least one of a minimal start erase voltage, minimal number of maximal allowable erase pulses, minimal erase pulse width, minimal erase voltage step, erase verify level, maximal number of non-erased cells and maximal erase voltage level.

8. The non-transitory computer readable medium according to claim 1, that stores instructions for finding a set of programming parameters that comprises at least one of a maximal start programming voltage, minimal number of maximal allowable programming pulses, minimal programming voltage step, minimal programming pulse width, program verify levels, maximal number of non-verified cells, and minimal program bias voltage.

9. The non-transitory computer readable medium according to claim 1, that stores instructions for finding a selected set of evaluated parameters that has a smallest effect on the wear of the group of flash memory cells out of a plurality of sets of evaluated parameters that once applied introduce a tolerable deviation in a voltage threshold distribution.

10. The non-transitory computer readable medium according to claim 1, that stores instructions for evaluating sets of evaluated parameters wherein each set of erase parameters is sub-optimal in a context of voltage threshold distribution.

11. The non-transitory computer readable medium according to claim 1, that stores instructions for finding a set of erase parameters in response to a duration attribute of erase operations to be obtained when applying the set of erase parameters.

12. The non-transitory computer readable medium according to claim 1, that stores instructions for ignoring the sets of erase parameters that once applied result in the average duration of erase operations that exceeds the erase duration threshold.

13. The non-transitory computer readable medium according to claim 12, that stores instructions for altering a value of the erase duration threshold in response to values of the wear level.

14. The non-transitory computer readable, medium according to claim 1, that stores instructions for finding a set of programming parameters in response to a duration attribute of programming operations to be obtained when applying the set of programming parameters.

15. The non-transitory computer readable medium according to claim 1, that stores instructions for ignoring the sets of programming parameters that once applied result in the average duration of programming operations that exceeds the programming duration threshold.

16. The non-transitory computer readable medium according to claim 15, that stores instructions for altering a value of the programming length threshold in response to values of the wear level.

17. The non-transitory computer readable medium according to claim 1, wherein the evaluating of the plurality of sets of evaluated parameters comprises calculating a score per each set of evaluated parameter.

18. The non-transitory computer readable medium according to claim 17, wherein a score of a set of evaluated parameter is responsive to number of corrected read errors resulting from a read operation that follows a programming operation that was executed by applying programming parameters of the set of the evaluated parameter.

19. The non-transitory computer readable medium according to claim 1, that stores instructions for calculating a score of a set of evaluated parameters in response to at least one value of at least one parameter of the set of evaluated parameters.

20. The non-transitory computer readable medium according to claim 1, that stores instructions for calculating a score of a set of evaluated parameters in response to the wear level.

21. The non-transitory computer readable medium according to claim 1, that stores instructions for calculating a score of a set of evaluated parameters in response to statistical attribute of the voltage threshold distribution resulting from applying the set of evaluated parameters.

22. The non-transitory computer readable medium according to claim 1, that stores instructions for finding a set of evaluated parameters that once applied results in manageable level of bit error rates that exceeds a minimal allowable level of bit error rates.

23. The non-transitory computer readable medium according to claim 1, that stores instructions for selecting a set of evaluated parameters that once applied results in manageable level of bit error rates and has a smallest contribution to a wear level of the at least one group of flash memory cells.

24. The non-transitory computer readable medium according to claim 1, that stores instructions for selecting the set of evaluated parameters that once applied results in the higher bit error rate at low wear levels and the lower increment rate of bit error rates per wear level in relation to the at least one other set of evaluated parameters.

25. The non-transitory computer readable medium according to claim 1, that stores instructions for selecting the set of evaluated parameters that once applied results in (a) the higher bit error rate and the lower programming duration at low wear levels and (b) the lower increment rate of bit error rates per wear level in relation to the at least one other set of evaluated parameters.

26. The non-transitory computer readable medium according to claim 1, that stores instructions for selecting the set of evaluated parameters that once applied results in the higher bit error rate at low wear levels and at the lower increment rate of bit error rates per wear level in relation to the reference set of parameters that is expected to be applied regardless of the wear level of the at least one group of flash memory cells.

27. The non-transitory computer readable medium according to claim 1, wherein each set of evaluated parameters comprises erase and programming parameters of values that once applied will not result in a corruption of data programmed to the flash memory device.

28. The non-transitory computer readable medium according to claim 1, wherein each set of evaluated parameters comprises programming parameters that are applied during programming operations of information that is not related to the finding of the erase parameters and the programming parameters.

29. The non-transitory computer readable medium according to claim 1, wherein the finding comprises applying a steepest decent algorithm.

30. The non-transitory computer readable medium according to claim 1, wherein the finding comprises changing a value of a single evaluated parameter between one set of evaluated parameter to another.

31. The non-transitory computer readable medium according to claim 1, that stores instructions for evaluating a single set of evaluated parameters based upon an outcome of multiple read attempts.

32. The non-transitory computer readable medium according to claim 1, wherein the finding is triggered when a bit error rate, which is calculated during a read operation, is associated with information programmed to at least one group of flash memory cells reaches a predetermined value.

33. The non-transitory computer readable medium according to claim 1, that stores instructions for finding a set of erase parameters that once applied minimizes a wear level increment resulting from a programming operation.

34. A non-transitory computer readable medium for flash memory device parameter optimization, the non-transitory computer readable medium stores instructions for: receiving or generating an estimate of a wear level of at least one group of flash memory cells of the flash memory device; finding erase parameters and programming parameters to be applied on one or more groups of flash memory cells of the flash memory device in response to estimate the wear level;
    wherein the finding comprises evaluating a plurality of sets of evaluated parameters that differ from each other by a value of at least one parameter, wherein each one of the plurality of sets of evaluated parameters comprise at least one out of a set of erase parameters and a set of programming parameters:
    wherein possible values of the estimate of the wear level belong to a range of wear levels that comprises multiple non-overlapping sub-ranges of wear levels;
    wherein the finding is executed at least once for each one for each sub-range of wear levels.

35. The non-transitory computer readable medium according to claim 34, that stores instructions for finding at a beginning of each sub-range of wear levels, erase parameters and programming parameters to be applied during the entire sub-range of wear levels.

36. The non-transitory computer readable medium according to claim 34, wherein sub-ranges of higher order are associated with higher wear levels; wherein the non-transitory computer readable medium stores instructions for modifying at least one parameter out of a number of maximal allowable programming pulses, start program voltage, programming voltage step, programming window, number of non-verified programmed cells, program pulse width and program bias voltage with an increase of an order to the sub-range.

37. The non-transitory computer readable medium according to claim 34, wherein sub-ranges of higher order are associated with higher wear levels; wherein the non-transitory computer readable medium stores instructions for modifying at least one parameter out of a start erase voltage, a number of maximal allowable erase pulses, an erase voltage step and erase pulse width with an increase of an order to the sub-range.

38. A non-transitory computer readable medium for flash memory device parameter optimization, the non-transitory computer readable medium stores instructions for: receiving or generating an estimate of a wear level of at least one group of flash memory cells of the flash memory device; finding erase parameters and programming parameters to be applied on one or more groups of flash memory cells of the flash memory device in response to estimate the wear level;
    wherein the finding comprises evaluating a plurality of sets of evaluated parameters that differ from each other by a value of at least one parameter, wherein each one of the plurality of sets of evaluated parameters comprise at least one out of a set of erase parameters and a set of programming parameters;
    wherein the finding comprising repetitively programming same information to multiple groups of flash memory cells while applying different sets of programming parameters that differ from each other.

39. The non-transitory computer readable medium according to claim 38, that stores instructions for repetitively programming the same information to multiple groups of flash memory cells is a probability of a programming operation failure exceeds a threshold.

40. A non-transitory computer readable medium for flash memory device parameter optimization, the non-transitory computer readable medium stores instructions for receiving or generating an estimate of a wear level of at least one group of flash memory cells of the flash memory device; finding erase parameters and programming parameters to be applied on one or more groups of flash memory cells of the flash memory device in response to estimate the wear level;
    wherein the finding comprises evaluating a plurality of sets of evaluated parameters that differ from each other by a value of at least one parameter, wherein each one of the plurality of sets of evaluated parameters comprise at least one out of a set of erase parameters and a set of programming parameters;

wherein the finding comprising repetitively programming same pilot information to multiple groups of flash memory cells while applying different sets of programming parameters that differ from each other.

41. A non-transitory computer readable medium for flash memory device parameter optimization, the non-transitory computer readable medium stores instructions for receiving or generating an estimate of a wear level of at least one group of flash memory cells of the flash memory device; finding erase parameters and programming parameters to be applied on one or more groups of flash memory cells of the flash memory device in response to estimate the wear level;

wherein the finding comprises evaluating a plurality of sets of evaluated parameters that differ from each other by a value of at least one parameter, wherein each one of the plurality of sets of evaluated parameters comprise at least one out of a set of erase parameters and a set of programming parameters;

evaluating a first set of evaluated parameters; calculating a first score; changing a single parameter of the first set to provide a second set of evaluated parameters that comprises a single changed parameter; wherein the changing is performed along a first change direction; evaluating the second set of evaluated parameters; calculating a second score; determining, in response to the first and second scores, whether the first set of evaluated parameters achieves better results than the second set of evaluated parameters; if it is determined that the first set of evaluated parameters achieves better results than the second set of evaluated parameters then changing the single changed parameter along a second change direction that differs from the first change direction to provide a third set of evaluated parameters; if it is determined that the first set of evaluated parameters achieves worse results than the second set of evaluated parameters then changing the single changed parameter along the first direction to provide the third set of evaluated parameters.

42. A method for flash memory device parameter optimization, the method comprises:

receiving or generating an estimate of a wear level of at least one group of flash memory cells of the flash memory device; and finding erase parameters and programming parameters to be applied on one or more groups of flash memory cells of the flash memory device in response to estimate of the wear level; wherein the finding comprises evaluating a plurality of sets of evaluated parameters that differ from each other by a value of at least one parameter, wherein each one of the plurality of sets of evaluated parameters comprise at least one out of a set of erase parameters and a set of programming parameters;

wherein the method comprises at least one out of:
(a) ignoring sets of erase parameters that once applied result in an average duration of erase operations that exceeds an erase duration threshold,
(b) ignoring sets of programming parameters that once applied result in an average duration of programming operations that exceeds a programming duration threshold,
(c) selecting a set of evaluated parameters that once applied results in a higher bit error rate at low wear levels and a lower increment rate of bit error rates per wear level in relation to at least one other set of evaluated parameters,
(d) selecting a set of evaluated parameters that once applied results in (i) a higher bit error rate and a lower programming duration at low wear levels and (ii) a lower increment rate of bit error rates per wear level in relation to at least one other set of evaluated parameters, and
(e) selecting a set of evaluated parameters that once applied results in a higher bit error rate at low wear levels and at a lower increment rate of bit error rates per wear level in relation to a reference set of parameters that is expected to be applied regardless of a wear level of the at least one group of flash memory cells.

43. A flash memory controller that is arranged to receive or generate an estimate of a wear level of at least one group of flash memory cells of the flash memory device; and find erase parameters and programming parameters to be applied on one or more groups of flash memory cells of the flash memory device in response to estimate of the wear level; wherein the flash memory controller is arranged to find the erase parameters and the programming parameters by evaluating a plurality of sets of evaluated parameters that differ from each other by a value of at least one parameter, wherein each one of the plurality of sets of evaluated parameters comprise at least one out of a set of erase parameters and a set of programming parameters; wherein the flash memory controller is arranged perform at least one out of: (a) ignore sets of erase parameters that once applied result in an average duration of erase operations that exceeds an erase duration threshold, (b) ignore sets of programming parameters that once applied result in an average duration of programming operations that exceeds a programming duration threshold, (c) select a set of evaluated parameters that once applied results in a higher bit error rate at low wear levels and a lower increment rate of bit error rates per wear level in relation to at least one other set of evaluated parameters, (d) select a set of evaluated parameters that once applied results in (i) a higher bit error rate and a lower programming duration at low wear levels and (ii) a lower increment rate of bit error rates per wear level in relation to at least one other set of evaluated parameters, and (e) select a set of evaluated parameters that once applied results in a higher bit error rate at low wear levels and at a lower increment rate of bit error rates per wear level in relation to a reference set of parameters that is expected to be applied regardless of a wear level of the at least one group of flash memory cells.

* * * * *